US012791439B2

(12) United States Patent
Davis et al.

(10) Patent No.: US 12,791,439 B2
(45) Date of Patent: Nov. 10, 2026

(54) CAVITATION DETECTION USING TORQUE LOAD AND/OR INSTANTANEOUS FUEL CONSUMPTION

(71) Applicant: Cattron North America, Inc., Warren, OH (US)

(72) Inventors: Brett Allen Davis, Roswell, GA (US); John Edward Geertsema, Jr., Roswell, GA (US)

(73) Assignee: Cattron North America, Inc., Warren, OH (US)

( * ) Notice: Subject to any disclaimer, the term of this patent is extended or adjusted under 35 U.S.C. 154(b) by 434 days.

(21) Appl. No.: 18/387,285

(22) Filed: Nov. 6, 2023

(65) Prior Publication Data

US 2024/0068910 A1 Feb. 29, 2024

Related U.S. Application Data

(63) Continuation-in-part of application No. PCT/US2023/027397, filed on Jul. 11, 2023, and a (Continued)

(51) Int. Cl.
*G01M 15/05* (2006.01)
*G01R 31/34* (2020.01)

(52) U.S. Cl.
CPC ........... *G01M 15/05* (2013.01); *G01R 31/343* (2013.01)

(58) Field of Classification Search
CPC ............................ G01M 15/05; G01R 31/343
See application file for complete search history.

(56) References Cited

U.S. PATENT DOCUMENTS

| | | | | |
|---|---|---|---|---|
| 6,709,240 B1 * | 3/2004 | Schmalz | F04B 49/065 318/438 |
| 7,489,997 B2 * | 2/2009 | Iihoshi | F02D 41/1495 702/183 |

(Continued)

FOREIGN PATENT DOCUMENTS

| | | |
|---|---|---|
| EP | 2196678 | 7/2012 |
| EP | 2196678 B1 | 7/2012 |

(Continued)

OTHER PUBLICATIONS

CANplus CP1000;Cattron Control Panel Operation Manual; Dec. 2019; 59 pages.

(Continued)

*Primary Examiner* — Stephanie E Bloss
*Assistant Examiner* — Diana Hancock
(74) *Attorney, Agent, or Firm* — Harness, Dickey & Pierce, P.L.C.; Anthony G. Fussner

(57) ABSTRACT

Exemplary embodiments are disclosed of controllers (e.g., control panels, etc.) configured to be operable for detecting cavitation using torque load and/or instantaneous fuel consumption. In exemplary embodiments, a controller is configured to be operable for monitoring at least one of engine torque load and/or engine instantaneous fuel consumption for fluctuation (e.g., significant drop/downward fluctuation in average magnitude and/or erratic, noisy, fluctuating data, etc.) indicative of pump cavitation, thereby enabling the controller to be operable for alerting to indications of pump cavitation when fluctuation of the monitored engine torque load and/or engine instantaneous fuel consumption indicate pump cavitation.

25 Claims, 10 Drawing Sheets

Related U.S. Application Data continuation-in-part of application No. 18/220,686, filed on Jul. 11, 2023, now Pat. No. 12,607,971, which is a continuation-in-part of application No. PCT/US2023/027397, filed on Jul. 11, 2023.

(60) Provisional application No. 63/546,128, filed on Oct. 27, 2023, provisional application No. 63/426,559, filed on Nov. 18, 2022, provisional application No. 63/388,504, filed on Jul. 12, 2022, provisional application No. 63/389,798, filed on Jul. 15, 2022, provisional application No. 63/396,136, filed on Aug. 8, 2022.

(56) References Cited

U.S. PATENT DOCUMENTS

| | | | | |
|---|---|---|---|---|
| 2011/0257934 | A1* | 10/2011 | Dimino | G01R 31/343 702/183 |
| 2018/0038216 | A1* | 2/2018 | Zhang | G01L 5/0071 |
| 2021/0081823 | A1 | 3/2021 | Boguslawski et al. | |
| 2022/0090485 | A1 | 3/2022 | Boguslawski et al. | |
| 2022/0170987 | A1* | 6/2022 | Matsumoto | G01R 31/343 |
| 2023/0366933 | A1* | 11/2023 | Dutrey | H02P 29/024 |

FOREIGN PATENT DOCUMENTS

| | | | |
|---|---|---|---|
| EP | 2500579 | | 9/2012 |
| EP | 2500579 | A1 | 9/2012 |
| EP | 4299908 | | 1/2024 |
| EP | 4299908 | A1 | 1/2024 |
| WO | WO-2019209766 | A1 | 10/2019 |
| WO | WO-2021/150358 | A1 | 7/2021 |
| WO | 2024015377 | | 1/2024 |
| WO | WO-2024015377 | A1 | 1/2024 |

OTHER PUBLICATIONS

International Search Report and Written Opinion for PCT/US2023/027397 that is the parent application to the instant application; Oct. 27, 2023; 9 pages.

European Search Report for European Patent Application EP23209440 dated Apr. 3, 2024.

European Office Action for EP23209440.9 that claims priority to the instant application; dated Jan. 29, 2025; 5 pages.

* cited by examiner

CAVITATION DETECTION USING TORQUE LOAD AND/OR INSTANTANEOUS FUEL CONSUMPTION

CROSS-REFERENCE TO RELATED APPLICATIONS

This application claims priority to and the benefit of U.S. Provisional Patent Application No. 63/426,559 filed Nov. 18, 2022.

This application claims priority to and the benefit of U.S. Provisional Patent Application No. 63/546,128 filed Oct. 27, 2023.

This application is a continuation-in-part of PCT International Patent Application Number PCT/US23/27397 filed Jul. 11, 2023.

This application is a continuation-in-part of U.S. patent application Ser. No. 18/220,686 filed Jul. 11, 2023, which, in turn, is continuation application of PCT International Patent Application Number PCT/US23/27397.

U.S. patent application Ser. No. 18/220,686 and PCT International Patent Application Number PCT/US23/27397 claim the benefit of and priority to:

(1) U.S. Provisional Patent Application Ser. No. 63/388,504 filed Jul. 12, 2022;

(2) U.S. Provisional Patent Application Ser. No. 63/389,798 filed Jul. 15, 2022; and (3) U.S. Provisional Patent Application Ser. No. 63/396,136 filed Aug. 8, 2022. The entire disclosures of the above patent applications are incorporated herein by reference.

FIELD

The present disclosure generally relates to controllers (e.g., control panels, etc.) configured to be operable for detecting pump cavitation using torque load and/or instantaneous fuel consumption.

BACKGROUND

This section provides background information related to the present disclosure which is not necessarily prior art.

Control panels are commonly used for controlling operation of engines, motors, and machines. This includes monitoring numerous parameters such as oil pressure, water pressure, engine torque, engine fuel consumption, water flow, vibration, etc.

DRAWINGS

The drawings described herein are for illustrative purposes only of selected embodiments and not all possible implementations and are not intended to limit the scope of the present disclosure.

FIG. 1 is a line graph of engine fuel rate (in liters/hour) and engine torque load (as a percentage of maximum engine torque load) versus time. FIG. 1 also illustrates fluctuation of the engine fuel rate and engine torque load that are indicative of pump cavitation according to exemplary embodiments disclosed herein.

FIG. 2 illustrates an exemplary embodiment of a system that includes a controller (e.g., a machine-learning control panel, etc.) configured to be operable for controlling an engine (e.g., diesel engine, etc.), which, in turn, is operable for driving (e.g., mechanically spinning, etc.) a pump. The controller is configured to be operable for monitoring the engine's torque load and/or instantaneous fuel consumption for fluctuation (e.g., significant drop/downward fluctuation in average magnitude and/or erratic, noisy, fluctuating data as shown in FIGS. 1 and 10, etc.) indicative of pump cavitation, which, in turn, enables the controller to be operable for alerting to indications of pump cavitation when fluctuation of the monitored torque load and/or instantaneous fuel consumption indicate pump cavitation.

FIG. 3 illustrates an exemplary embodiment of a system that includes controller (e.g., a machine-learning control panel, etc.) configured to be operable for controlling a variable frequency drive (VFD) and an electric motor, which, in turn, is operable for driving (e.g., mechanically spinning, etc.) a pump. The controller is configured to be operable for monitoring the electric motor's torque load and/or electrical power consumption for fluctuation (e.g., significant drop/downward fluctuation in average magnitude and/or erratic, noisy, fluctuating data as shown in FIGS. 1 and 10, etc.) indicative of pump cavitation, which, in turn, enables the controller to be operable for alerting to indications of pump cavitation when fluctuation of the monitored electric motor torque load and/or electrical power consumption indicate pump cavitation.

FIG. 4 illustrates an exemplary embodiment of a system that includes first and second controllers (e.g., first and second machine-learning control panels, etc.) configured to be operable for respectively controlling an electric motor and an engine, which, in turn, are respectively operable for driving (e.g., mechanically spinning, etc.) first and second pumps. The first controller is configured to be operable for monitoring the engine's torque load and/or instantaneous fuel consumption for fluctuation (e.g., significant drop/downward fluctuation in average magnitude and/or erratic, noisy, fluctuating data as shown in FIGS. 1 and 10, etc.) indicative of cavitation of the first pump. The second controller is configured to be operable for monitoring the electric motor's torque load and/or electrical power consumption for fluctuation (e.g., significant drop/downward fluctuation in average magnitude and/or erratic, noisy, fluctuating data as shown in FIGS. 1 and 10, etc.) indicative of cavitation of the second pump.

FIG. 5 illustrates an exemplary embodiment of a system including a controller (e.g., a machine-learning control panel, etc.) configured to be operable for controlling an engine, a variable frequency drive (VFD), and an electric motor. The engine and the electric motor are respectively operable for driving (e.g., mechanically spinning, etc.) first and second pumps. The controller is configured to be operable for monitoring the engine's torque load and/or instantaneous fuel consumption for fluctuation (e.g., significant drop/downward fluctuation in average magnitude and/or erratic, noisy, fluctuating data as shown in FIGS. 1 and 10, etc.) indicative of cavitation of the first pump. The controller is also configured to be operable for monitoring the electric motor's torque load and/or electric power consumption for fluctuation (e.g., significant drop/downward fluctuation in average magnitude and/or erratic, noisy, fluctuating data as shown in FIGS. 1 and 10, etc.) indicative of cavitation of the second pump.

Figure 1:
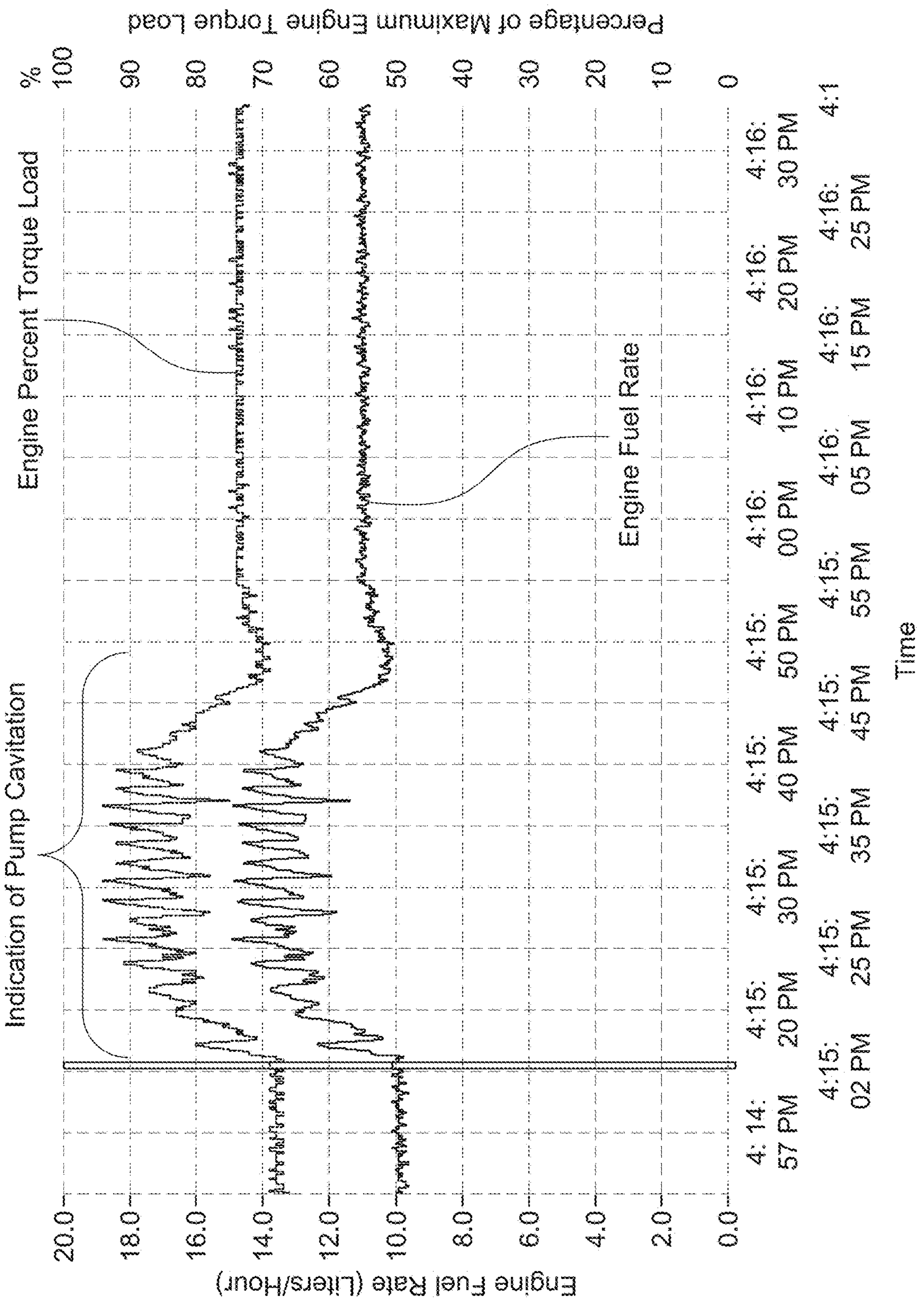
Figure 9:
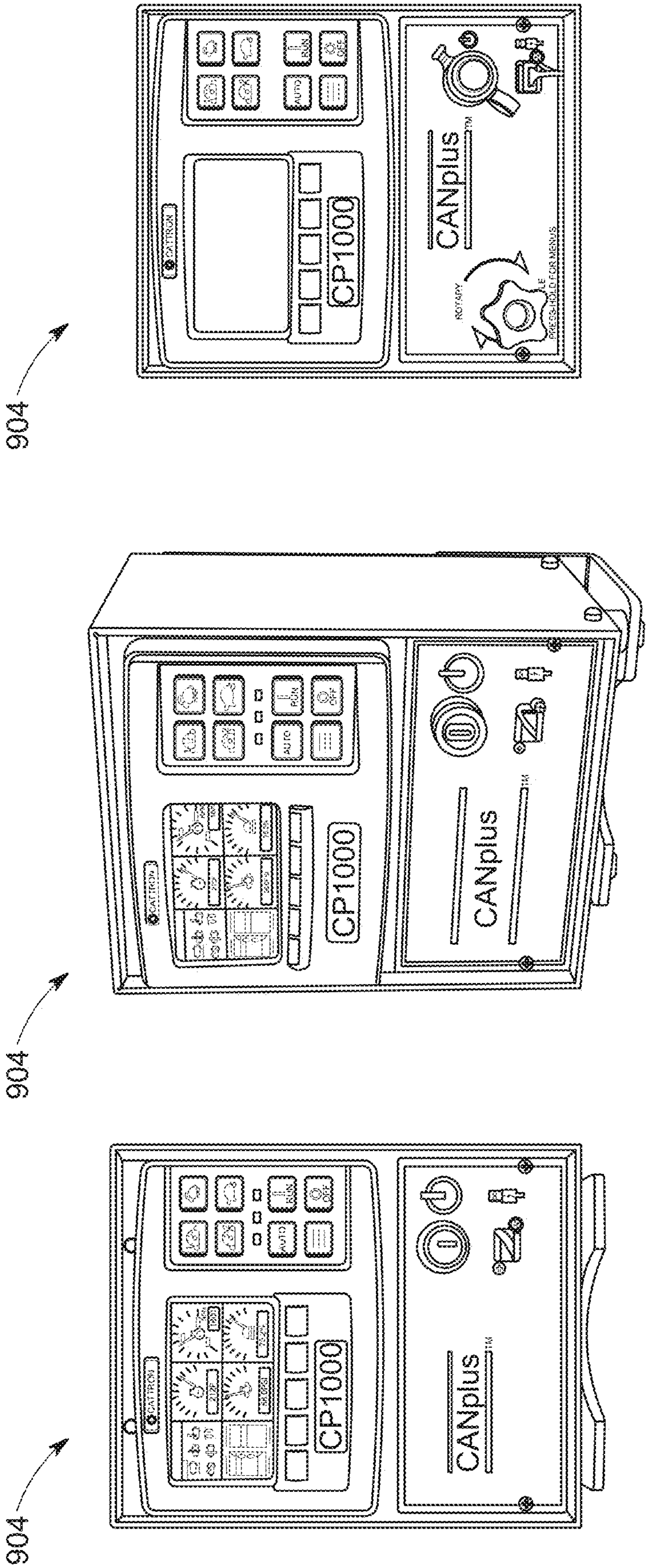
Figure 10:
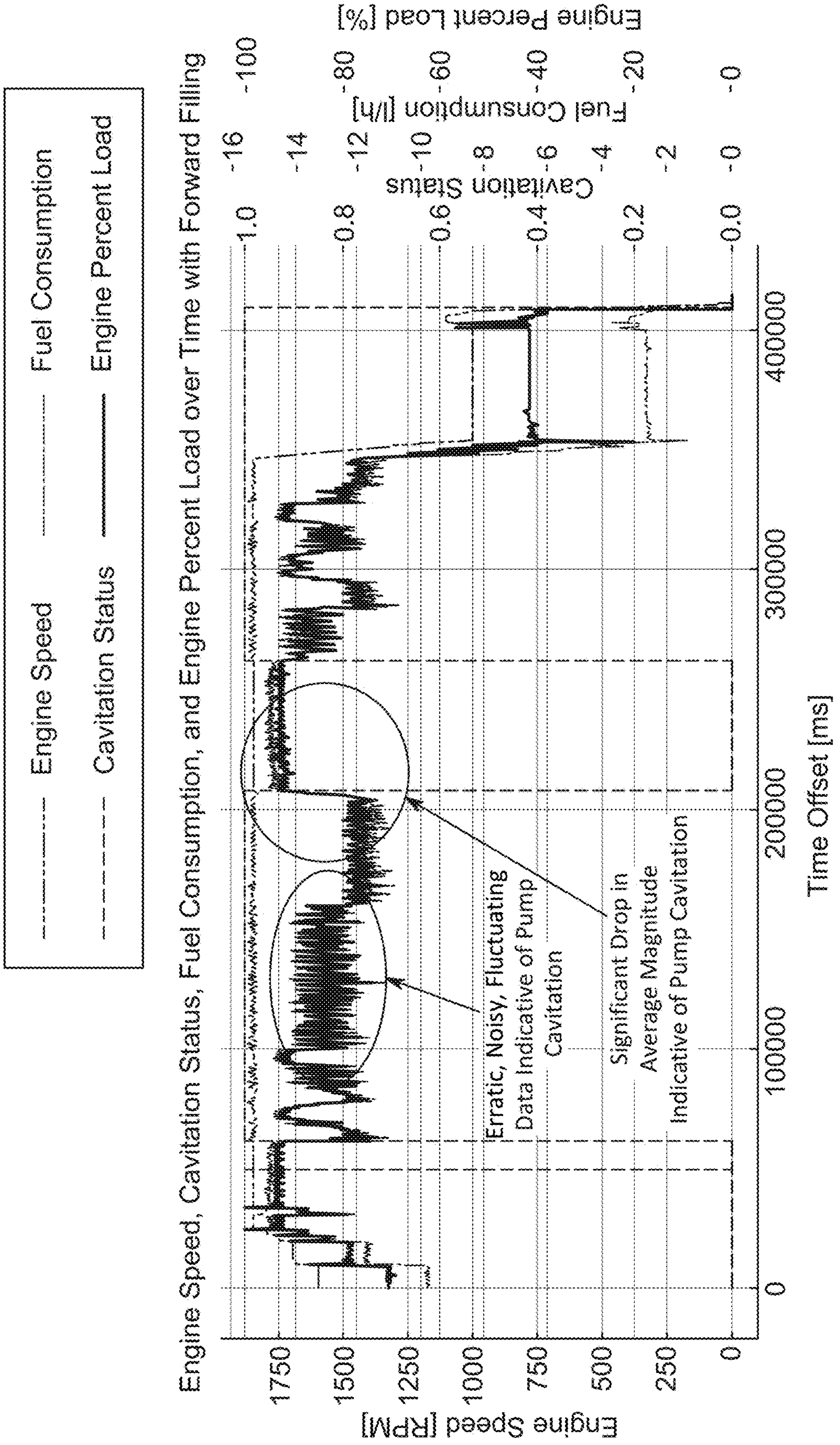

FIG. 9 shows an example CANplus™ CP1000 control panel that may be configured (e.g., via a firmware change, etc.) to be operable for monitoring torque load and/or fuel/power consumption for fluctuation (e.g., significant drop/downward fluctuation in average magnitude and/or erratic, noisy, fluctuating data as shown in FIGS. 1 and 10, etc.) indicative of pump cavitation according to exemplary embodiments disclosed herein.

FIG. 10 is an exemplary line graph obtained or captured from a controller (e.g., a machine-learning control panel, etc.) while controlling a diesel-powered water pump according to an exemplary embodiment. As shown in FIG. 10, the line graph includes engine speed (RPM) along the left axis versus time offset (milliseconds) along the bottom axis. The right axis of the line graph includes cavitation status, instantaneous fuel consumption (in liters/hour), and engine torque load (as a percentage of maximum engine torque load) versus the time offset along the bottom axis. The cavitation status is a binary indicator, where 0 indicates that no cavitation was detected and 1 indicates that the controller detected cavitation using suction and discharge pressure sensors as well as a vibration sensor mounted to the pump. The diesel engine's instantaneous fuel consumption and torque load percentage are broadcasted by most electronically-controlled engines. Generally, the graph shows that when cavitation is detected by the controller (cavitation status line at a value of 1), the overall fuel consumption and torque both significantly drop in average magnitude and become very erratic (not smooth) as compared to times when cavitation is not occurring (cavitation status line at a value of 0). In exemplary embodiments, the controller is configured to be operable for detecting the significant drop/downward fluctuation in average magnitude (e.g., 15% to 20% change, etc.) of the diesel engine's instantaneous fuel consumption and/or to detect the significant drop/downward fluctuation in average magnitude (e.g., 15% to 20% change, etc.) of the engine torque load percentage. The detection of either or both significant drops in average magnitude of the diesel engine's instantaneous fuel consumption and engine torque load percentage are indicative of pump cavitation. In such exemplary embodiments, the controller may therebefore be able to detect pump cavitation after the machine/system has settled in at a particular RPM (e.g., about 1900 RPMs, etc.) by detecting either or both of a significant drop/downward fluctuation in average magnitude of the diesel engine's instantaneous fuel consumption and/or a significant drop/downward fluctuation in magnitude engine torque load percentage without having to also detect erratic behavior in the instantaneous fuel consumption and engine torque load percentage and without having to rely upon sensors (e.g., vibration sensor, etc.) to monitor the pump.

Corresponding reference numerals may indicate corresponding (though not necessarily identical) parts throughout the several views of the drawings.

DETAILED DESCRIPTION

Example embodiments will now be described more fully with reference to the accompanying drawings.

Pump cavitation can damage pumps. Conventionally, vibration sensors have been used to detect pump cavitation. But as recognized by the inventors hereof, pump cavitation is detectable by using torque load and/or fuel/power consumption. Engine torque load and instantaneous fuel consumption are commonly reported by the engine's electronic control unit. Advantageously, exemplary controllers disclosed herein are able to detect cavitation by monitoring at least one of engine torque load and/or engine instantaneous fuel consumption for fluctuation (e.g., significant drop/downward fluctuation in average magnitude and/or erratic, noisy, fluctuating data as shown in FIGS. 1 and 10, etc.) indicative of pump cavitation without requiring any additional sensors. As disclosed herein, a machine-learning controller may be configured to be operable detecting one or more or all of the following that may be used individually or in combination as an indicator of pump cavitation after the machine/system has settled in at a particular RPM:

(1) a significant drop/downward fluctuation in average magnitude of fuel/power consumption (e.g., engine instantaneous fuel consumption, motor power consumption); and/or (2) a significant drop/downward fluctuation in average magnitude of torque load percentage (e.g., engine torque load percentage, motor torque load percentage); and/or (3) erratic, noisy, fluctuating data (e.g., data that is changing over a short period of time) in the fuel/power consumption; and/or (4) erratic, noisy, fluctuating data in the torque load percentage.

In exemplary embodiments, a controller (e.g., a machine-learning control panel, etc.) is configured to be operable for receiving engine torque load and instantaneous fuel consumption values sent by an engine's electronic control unit, e.g., via a controller area network (CAN Bus), etc. Normally, there is little fluctuation with these two parameters after the machine/system has settled in at a particular RPM. But as recognized by the inventors hereof, fluctuation (e.g., significant drop/downward fluctuation in average magnitude and/or erratic, noisy, fluctuating data, etc.) in either or both of these two parameters can be detected or seen that are indicative of pump cavitation, such as shown in FIGS. 1 and 10, etc. In addition, existing controllers may be configured (e.g., via a firmware change, etc.) with the capability of detecting and then alerting to indications of pump cavitation without requiring any additional sensors according to exemplary embodiments disclosed herein.

Figure 2:
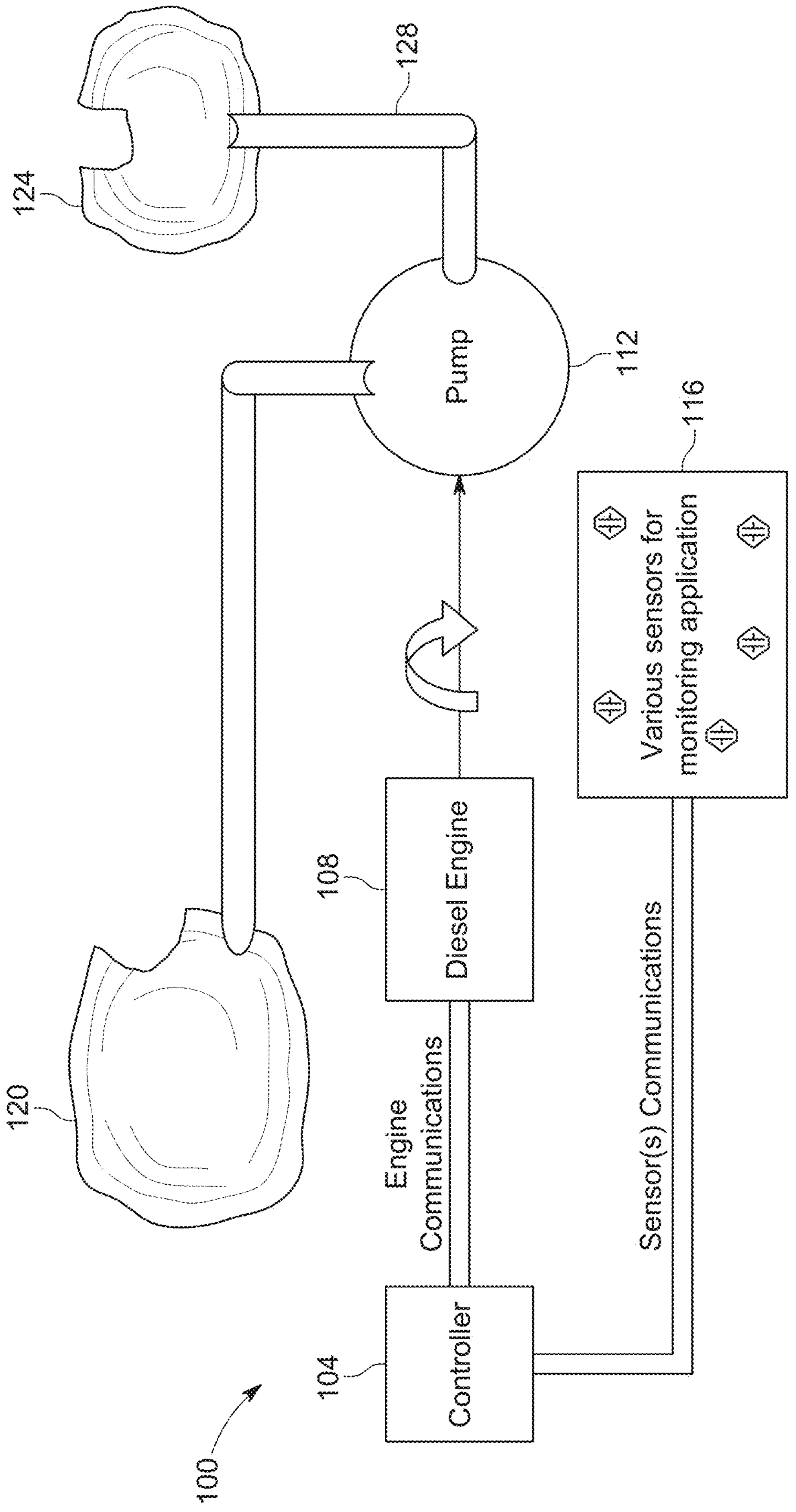

FIG. 2 illustrates an exemplary embodiment of a system 100 that includes a controller 104 embodying one or more aspects of the present disclosure. The controller 104 is configured to be operable for controlling an engine 108 (e.g., diesel engine, etc.), which, in turn, is operable for driving (e.g., mechanically spinning, etc.) a pump 112.

The controller 104 is in communication with an electronic control unit of the engine 108, e.g., via a controller area network (CAN Bus), etc.). The controller 104 is configured to be operable for receiving engine torque load information and/or engine instantaneous fuel consumption from the engine's electronic control unit. The controller 104 is configured to be operable for monitoring either or both of the engine torque load information and/or engine instantaneous fuel consumption information, received from the engine's electronic control unit, for fluctuation (e.g., significant drop/downward fluctuation in average magnitude and/or erratic, noisy, fluctuating data as shown in FIGS. 1 and 10, etc.) indicative of cavitation of the pump 112.

The controller 104 may be operable for determining whether fluctuation of the monitored engine torque load is outside of an acceptable range or error threshold (e.g., a positive/negative (+/−) percentage error threshold of 6%, higher or lower than +/−6%, a user-selected or adjusted positive/negative (+/−) percentage error threshold, etc.). For example, the controller 104 may be configured to be operable for executing a machine learning process during which the controller 104 learns steady state fluctuation of engine torque load and from that learns or establishes a default setting (e.g., +/−6%, etc.) for the acceptable range or error threshold for the fluctuation of engine torque load. The controller 104 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored engine torque load is outside its acceptable range or error threshold, the controller 104 (e.g., via application programming or software, etc.) may then issue a warning (e.g., a warning alarm, a shutdown alarm, display or present an error message, etc.) and/or initiate a shutdown of the engine 108 driving the pump 112.

Additionally, or alternatively, the controller 104 may be operable for determining whether fluctuation of the monitored engine instantaneous fuel consumption is outside of an acceptable range or error threshold (e.g., +1-6%, higher or lower than +/−6%, a user-selected or adjusted positive/negative (+/−) percentage error threshold, etc.). For example, the controller 104 may be configured to be operable for executing a machine learning process during which the controller 104 learns steady state fluctuation of engine instantaneous fuel consumption and from that learns or establishes a default setting (e.g., +/−6%, etc.) for the acceptable range or error threshold for the fluctuation of engine instantaneous fuel consumption. The controller 104 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored engine instantaneous fuel consumption is outside its acceptable range or error threshold, the controller 104 may then issue a warning (e.g., a warning alarm, a shutdown alarm, display or present an error message, an alert indicating that maintenance is needed, etc.) and/or the controller 104 initiate a shutdown of the engine 108 driving the pump 112.

Additionally, or alternatively, the controller 104 may be operable for determining whether there is a significant drop in the average magnitude of the monitored engine torque load that exceeds an acceptable range or threshold, e.g., 15% to 20%, higher than 20%, a user-selected percentage threshold, etc. For example, the controller 104 may be configured to be operable for executing a machine learning process (e.g., a learning algorithm, etc.) during which the controller 104 learns or establishes a default setting (e.g., 15% to 20%, etc.) for the acceptable range or threshold for the significant drop in the average magnitude of the monitored engine torque load. The controller 104 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine torque load that exceeds the acceptable range or threshold, the controller 104 may then issue a warning (e.g., a warning alarm, a shutdown alarm, display or present an error message, an alert indicating that maintenance is needed, etc.) and/or the controller 104 initiate a shutdown of the engine 108 driving the pump 112.

The controller 104 may also or instead be operable for determining whether there is a significant drop in the average magnitude of the monitored engine instantaneous fuel consumption that exceeds an acceptable range or threshold, e.g., 15% to 20%, higher than 20%, a user-selected percentage threshold, etc. For example, the controller 104 may be configured to be operable for executing a machine learning process (e.g., a learning algorithm, etc.) during which the controller 104 learns or establishes a default setting (e.g., 15% to 20%, etc.) for the acceptable range or threshold for the significant drop in the average magnitude of the monitored engine instantaneous fuel consumption. The controller 104 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine instantaneous fuel consumption that exceeds the acceptable range or threshold, the controller 104 may then issue a warning (e.g., a warning alarm, a shutdown alarm, display or present an error message, an alert indicating that maintenance is needed, etc.) and/or the controller 104 initiate a shutdown of the engine 108 driving the pump 112.

Accordingly, the controller 104 may be configured to be operable for detecting one or more or all of the following that may be used individually or in combination as an indicator of pump cavitation:

(1) a significant drop/downward fluctuation in average magnitude of the diesel engine's instantaneous fuel consumption; and/or (2) a significant drop/downward fluctuation in average magnitude of engine torque load percentage; and/or (3) erratic, noisy, fluctuating data (e.g., data that is changing over a short period of time) in the instantaneous fuel consumption; and/or (4) erratic, noisy, fluctuating data in the engine torque load percentage.

Advantageously, the controller 104 is thus able to detect and/or initiate alerts for indications of cavitation of the pump 112 by using the engine torque load information and/or engine instantaneous fuel consumption information received from the engine's electronic control unit without requiring reliance upon any existing or additional vibration sensors for detecting pump cavitation.

The controller 104 is also shown in communication with one or more sensors 116 (e.g., flow sensor(s), suction and/or discharge pressure sensors, tank level sensor(s) at source tank(s) and/or output tank(s), etc.). FIG. 2 shows the sensors 116 remotely spaced apart from the engine 108 and the pump 112. But the system 100 may also include one or more sensor(s) that are a part of, integrated with, or built into the engine 108 and/or the pump 112, such as a built-in pressure sensor within the pump 112, etc.

In response to output from the sensors 116 communicated to the controller 104 (e.g., via a hard wired connection, wireless connection, etc.), the controller 104 may control operation of the pump 112 by sending commands to the engine's electronic control unit (ECU) (e.g., via a controller area network (CAN bus), etc.) for controllably changing the speed of the engine 108 that is driving the pump 112. The pump 112 may comprise an industrial diesel driven pump at a water source 120 (e.g., lake, pond, river, reservoir, tank, other water source, etc.) that is operable for transferring water from the water source 120 to a second location 124.

Figure 3:
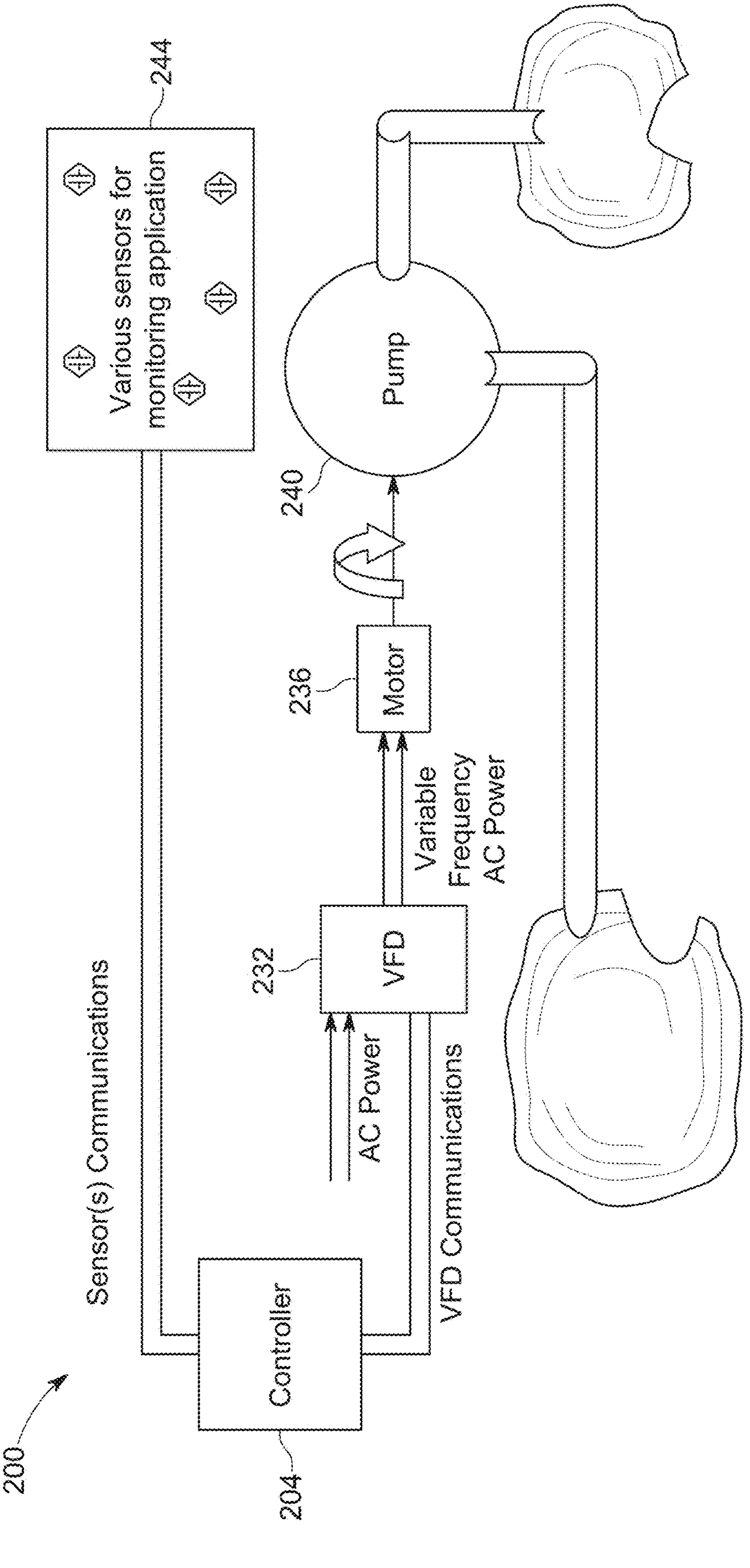

FIG. 3 illustrates an exemplary embodiment of a system 200 including a controller 204 embodying one or more aspects of the present disclosure. The controller 204 is configured to be operable for controlling a variable frequency drive (VFD) 232, e.g., via ModBus data communications protocol, etc. In turn, the VFD 232 enables speed control of a three-phase AC motor 236 (broadly, a motor) that drives (e.g., mechanically spins, etc.) a pump 240. The VFD 232 is operable for manipulating the frequency of the output by rectifying an incoming AC current into DC, and then using voltage pulse-width modulation (PWM) to recreate an AC current and voltage output waveform.

A communication link (e.g., hard wired connection, wireless connection, etc.) is provided from the controller 204 to the VFD 232. For example, a single cable or other suitable communication link may be provided from the controller 204 to the VFD 232.

The controller 204 is configured to be operable for monitoring either or both of the torque load and/or electrical power consumption of the motor 236 for fluctuation (e.g., significant drop/downward fluctuation in average magnitude and/or erratic, noisy, fluctuating data as shown in FIGS. 1 and 10, etc.) indicative of cavitation of the pump 240.

The controller 204 may be operable for determining whether fluctuation of the monitored motor torque load is outside of an acceptable range or error threshold (e.g., +1-6%, higher or lower than +/−6%, a user-selected or adjusted positive/negative (+/−) percentage error threshold, etc.). For example, the controller 204 may be configured to be operable for executing a machine learning process during which the controller 204 learns steady state fluctuation of motor torque load and from that learns or establishes a default setting (e.g., +/−6%, etc.) for the acceptable range or error threshold for the fluctuation of motor torque load. The controller 204 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored motor torque load is outside its acceptable range or error threshold, the controller 204 (e.g., via application programming or software, etc.) may then issue a warning (e.g., a warning alarm, a shutdown alarm, display or present an error message, an alert indicating that maintenance is needed, etc.) and/or the controller 204 may initiate a shutdown of the motor 236 driving the pump 240.

Additionally, or alternatively, the controller 204 may be operable for determining whether fluctuation of the monitored motor power consumption is outside of an acceptable range or error threshold (e.g., +/−6%, higher or lower than +/−6%, a user-selected or adjusted positive/negative (+/−) percentage error threshold, etc.). For example, the controller 204 may be configured to be operable for executing a machine learning process during which the controller 204 learns steady state fluctuation of motor power consumption and from that learns or establishes a default setting (e.g., +/−6%, etc.) for the acceptable range or error threshold for the fluctuation of motor power consumption. The controller 204 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored motor power consumption is outside its acceptable range or error threshold, the controller 204 may then issue a warning and/or initiate a shutdown of the motor 236 driving the pump 240.

Additionally, or alternatively, the controller 204 may be operable for determining whether there is a significant drop in the average magnitude of the monitored engine torque load that exceeds an acceptable range or threshold, e.g., 15% to 20%, higher than 20%, a user-selected percentage threshold, etc. For example, the controller 204 may be configured to be operable for executing a machine learning process (e.g., a learning algorithm, etc.) during which the controller 204 learns or establishes a default setting (e.g., 15% to 20%, etc.) for the acceptable range or threshold for the significant drop in the average magnitude of the monitored engine torque load. The controller 204 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine torque load that exceeds the acceptable range or threshold, the controller 204 may then issue a warning and/or initiate a shutdown of the motor 236 driving the pump 240.

The controller 204 may also or instead be operable for determining whether there is a significant drop in the average magnitude of the monitored motor power consumption that exceeds an acceptable range or threshold, e.g., 15% to 20%, higher than 20%, a user-selected percentage threshold, etc. For example, the controller 204 may be configured to be operable for executing a machine learning process (e.g., a learning algorithm, etc.) during which the controller 204 learns or establishes a default setting (e.g., 15% to 20%, etc.) for the acceptable range or threshold for the significant drop in the average magnitude of the monitored motor power consumption. The controller 204 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored motor power consumption that exceeds the acceptable range or threshold, the controller 204 may then issue a warning and/or initiate a shutdown of the motor 236 driving the pump 240.

Accordingly, the controller 204 may be configured to be operable for detecting one or more or all of the following that may be used individually or in combination as an indicator of pump cavitation:

(1) a significant drop/downward fluctuation in average magnitude of the motor power consumption; and/or
(2) a significant drop/downward fluctuation in average magnitude of motor torque load percentage; and/or
(3) erratic, noisy, fluctuating data (e.g., data that is changing over a short period of time) in the motor power consumption; and/or
(4) erratic, noisy, fluctuating data in the motor torque load percentage.

Advantageously, the controller 204 is thus able to detect and/or initiate alerts for indications of cavitation of the pump 240 by using the motor torque load information and/or motor power consumption without requiring reliance upon any existing or additional vibration sensors for detecting pump cavitation.

The controller 204 is also shown in communication with one or more sensors 244 (e.g., flow sensor(s), suction and/or discharge pressure sensors, tank level sensor(s) at source tank(s) and/or output tank(s), etc.). FIG. 3 shows the sensors 244 remotely spaced apart from the motor 236 and the pump 240. But the system 200 may also include one or more sensor(s) that are a part of, integrated with, or built into the motor 236 and/or the pump 240, such as a built-in pressure sensor within the pump 240, etc.

In response to the sensor output (e.g., received via a hard wired connection, wireless connection, etc.), the controller 204 is configured to be operable for controlling the VFD 232, e.g., to start, vary the RPMs (revolutions per minute), and stop the motor 236 based on the configured behavior, etc.

Figure 4:
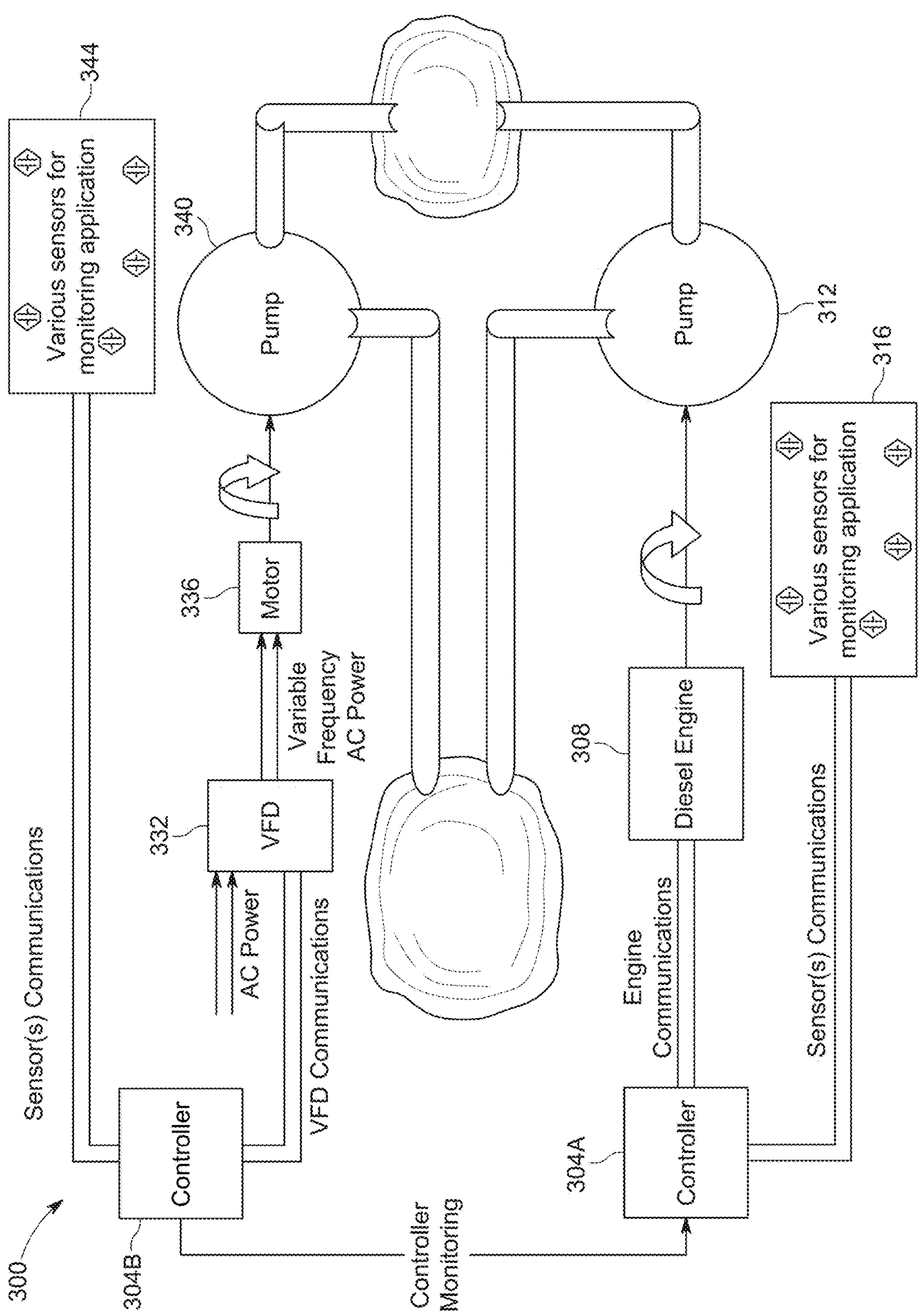

FIG. 4 illustrates an exemplary embodiment of a system 300 including first and second controllers 304A and 304B embodying one or more aspects of the present disclosure. The first and second controllers 304A and 304B and other system components shown in FIG. 3 may be identical or substantially similar to the respective controller 104 (FIG. 2) and controller 204 (FIG. 3) and corresponding system components described above.

For example, and similar to the controller 104 (FIG. 2), the first controller 304A is configured to be operable for controlling an engine 308 (e.g., diesel engine, etc.), which, in turn, is operable for driving (e.g., mechanically spinning, etc.) a first pump 312. The first controller 304A is configured to be operable for monitoring one or more sensors 316 (e.g., flow sensor(s), suction and/or discharge pressure sensors, tank level sensor(s) at source tank(s) and/or output tank(s), etc.). In response to the sensor output, the first controller 304A may control operation of the first pump 312 by sending commands to the engine's electronic control unit (ECU) (e.g., via a controller area network (CAN bus), etc.) for controllably changing the speed of the engine 308 that is driving the first pump 312.

The first controller 304A may be configured to be operable for receiving engine torque load information and/or engine instantaneous fuel consumption from the engine's electronic control unit. The first controller 304A is configured to be operable for monitoring either or both of the engine torque load information and/or engine instantaneous fuel consumption information, received from the engine's electronic control unit, for fluctuation (e.g., significant drop/downward fluctuation in average magnitude and/or erratic, noisy, fluctuating data as shown in FIGS. 1 and 10, etc.) indicative of cavitation of the pump 312.

The first controller 304A may be operable for determining whether fluctuation of the monitored engine torque load is outside of an acceptable range or error threshold (e.g., a positive/negative (+/−) percentage error threshold of 6%, higher or lower than +/−6%, a user-selected or adjusted positive/negative (+/−) percentage error threshold, etc.). For example, the first controller 304A may be configured to be operable for executing a machine learning process during which the first controller 304A learns steady state fluctuation of engine torque load and from that learns or establishes a default setting (e.g., +/−6%, etc.) for the acceptable range or error threshold for the fluctuation of engine torque load. The first controller 304A may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored engine torque load is outside its acceptable range or error threshold, the first controller 304A (e.g., via application programming or software, etc.) may then issue a warning (e.g., a warning alarm, a shutdown alarm, display or present an error message, an alert indicating that maintenance is needed, etc.) and/or the first controller 304A may initiate a shutdown of the engine 308 driving the pump 312.

Additionally, or alternatively, the first controller 304A may be operable for determining whether fluctuation of the monitored engine instantaneous fuel consumption is outside of an acceptable range or error threshold (e.g., +1-6%, higher or lower than +/−6%, a user-selected or adjusted positive/negative (+/−) percentage error threshold, etc.). For example, the first controller 304A may be configured to be operable for executing a machine learning process during which the first controller 304A learns steady state fluctuation of engine instantaneous fuel consumption and from that learns or establishes a default setting (e.g., +/−6%, etc.) for the acceptable range or error threshold for the fluctuation of engine instantaneous fuel consumption. The first controller 304A may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored engine instantaneous fuel consumption is outside its acceptable range or error threshold, the first controller 304A may then issue a warning (e.g., a warning alarm, a shutdown alarm, display or present an error message, etc.) and/or initiate a shutdown of the engine 308 driving the pump 312.

Additionally, or alternatively, the first controller 304A may be operable for determining whether there is a significant drop in the average magnitude of the monitored engine torque load that exceeds an acceptable range or threshold, e.g., 15% to 20%, higher than 20%, a user-selected percentage threshold, etc. For example, the first controller 304A may be configured to be operable for executing a machine learning process (e.g., a learning algorithm, etc.) during which the first controller 304A learns or establishes a default setting (e.g., 15% to 20%, etc.) for the acceptable range or threshold for the significant drop in the average magnitude of the monitored engine torque load. The first controller 304A may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine torque load that exceeds the acceptable range or threshold, the first controller 304A may then issue a warning (e.g., a warning alarm, a shutdown alarm, display or present an error message, etc.) and/or initiate a shutdown of the engine 308 driving the pump 312.

The first controller 304A may also or instead be operable for determining whether there is a significant drop in the average magnitude of the monitored engine instantaneous fuel consumption that exceeds an acceptable range or threshold, e.g., 15% to 20%, higher than 20%, a user-selected percentage threshold, etc. For example, the first controller 304A may be configured to be operable for executing a machine learning process (e.g., a learning algorithm, etc.) during which the first controller 304A learns or establishes a default setting (e.g., 15% to 20%, etc.) for the acceptable range or threshold for the significant drop in the average magnitude of the monitored engine instantaneous fuel consumption. The first controller 304A may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine instantaneous fuel consumption that exceeds the acceptable range or threshold, the first controller 304A may then issue a warning (e.g., a warning alarm, a shutdown alarm, display or present an error message, etc.) and/or initiate a shutdown of the engine 308 driving the pump 312.

Similar to the controller 204 (FIG. 3), the second controller 304B is configured to be operable for controlling a variable frequency drive (VFD) 332, which enables speed control of a three-phase AC motor 336 (broadly, a motor) that drives (e.g., mechanically spins, etc.) a second pump 340. The second controller 304B is configured to be operable for monitoring one or more sensors 344 (e.g., flow sensor(s), suction and/or discharge pressure sensors, tank level sensor(s) at source tank(s) and/or output tank(s), etc.). In response to the sensor output, the second controller 304B is configured to be operable for controlling the VFD 332, e.g., to start, vary the RPMs (revolutions per minute), and stop the motor 336 based on the configured behavior, etc.

The second controller 304B may be configured to be operable for monitoring either or both of the torque load and/or electrical power consumption of the motor 336 for fluctuation (e.g., significant drop/downward fluctuation in average magnitude and/or erratic, noisy, fluctuating data as shown in FIGS. 1 and 10, etc.) indicative of cavitation of the pump 340.

The second controller 304B may be operable for determining whether fluctuation of the monitored motor torque load is outside of an acceptable range or error threshold (e.g., +1-6%, higher or lower than +/−6%, a user-selected or adjusted positive/negative (+/−) percentage error threshold, etc.). For example, the second controller 304B may be configured to be operable for executing a machine learning process during which the second controller 304B learns steady state fluctuation of motor torque load and from that learns or establishes a default setting (e.g., +/−6%, etc.) for the acceptable range or error threshold for the fluctuation of motor torque load. The second controller 304B may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored motor torque load is outside its acceptable range or error threshold, the second controller 304B (e.g., via application programming or software, etc.) may then issue a warning (e.g., a warning alarm, a shutdown alarm, display or present an error message, an alert indicating that maintenance is needed, etc.) and/or the second controller 304B may initiate a shutdown of the motor 336 driving the pump 340.

Additionally, or alternatively, the second controller 304B may be operable for determining whether fluctuation of the monitored motor power consumption is outside of an acceptable range or error threshold (e.g., +/−6%, higher or lower than +/−6%, a user-selected or adjusted positive/negative (+/−) percentage error threshold, etc.). For example, the second controller 304B may be configured to be operable for executing a machine learning process during which the second controller 304B learns steady state fluctuation of motor power consumption and from that learns or establishes a default setting (e.g., +/−6%, etc.) for the acceptable range or error threshold for the fluctuation of motor power consumption. The second controller 304B may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored motor power consumption is outside its acceptable range or error threshold, the second controller 304B may then issue a warning and/or initiate a shutdown of the motor 336 driving the pump 340.

Additionally, or alternatively, the second controller 304B may be operable for determining whether there is a significant drop in the average magnitude of the monitored engine torque load that exceeds an acceptable range or threshold, e.g., 15% to 20%, higher than 20%, a user-selected percentage threshold, etc. For example, the second controller 304B may be configured to be operable for executing a machine learning process (e.g., a learning algorithm, etc.) during which the second controller 304B learns or establishes a default setting (e.g., 15% to 20%, etc.) for the acceptable range or threshold for the significant drop in the average magnitude of the monitored engine torque load. The second controller 304B may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine torque load that exceeds the acceptable range or threshold, the second controller 304B may then issue a warning and/or initiate a shutdown of the motor 336 driving the pump 340.

The second controller 304B may also or instead be operable for determining whether there is a significant drop in the average magnitude of the monitored motor power consumption that exceeds an acceptable range or threshold, e.g., 15% to 20%, higher than 20%, a user-selected percentage threshold, etc. For example, the second controller 304B may be configured to be operable for executing a machine learning process (e.g., a learning algorithm, etc.) during which the second controller 304B learns or establishes a default setting (e.g., 15% to 20%, etc.) for the acceptable range or threshold for the significant drop in the average magnitude of the monitored motor power consumption. The second controller 304B may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored motor power consumption that exceeds the acceptable range or threshold, the second controller 304B may then issue a warning and/or initiate a shutdown of the motor 336 driving the pump 340.

FIG. 4 shows the sensors 316 remotely spaced apart from the engine 308 and the first pump 312. But the system 300 may also include one or more sensor(s) that are a part of, integrated with, or built into the engine 308 and/or the first pump 312, such as a built-in pressure sensor within the first pump 312, etc. FIG. 4 also shows the sensors 344 remotely spaced apart from the motor 336 and the second pump 340. Again, however, the system 300 may also include one or more sensor(s) that are a part of, integrated with, or built into the motor 336 and/or the second pump 340, such as a built-in pressure sensor within the second pump 340, etc.

Figure 5:
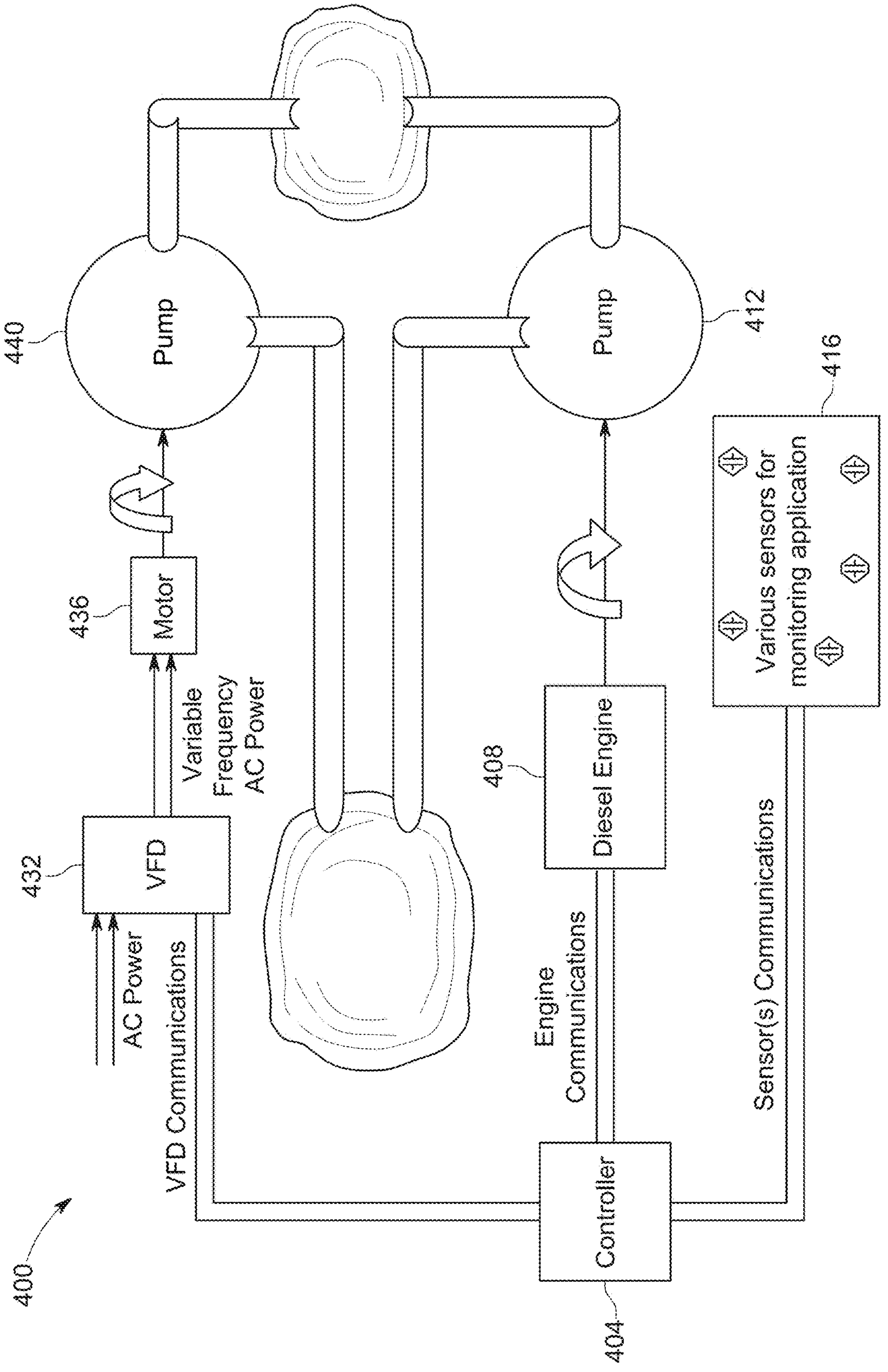

FIG. 5 illustrates an exemplary embodiment of a system 400 including a controller 404 embodying one or more aspects of the present disclosure. The controller 404 is configured to be operable for controlling a variable frequency drive (VFD) 432 and an engine 408, e.g., in response to or based on the controller's own communications and received sensor output from one or more sensors 416 (e.g., flow sensor(s), suction and/or discharge pressure sensors, tank level sensor(s) at source tank(s) and/or output tank(s), etc.) in communication with the controller 404, etc.

The controller 404 is configured for controlling operation of the VFD 432 itself, e.g., via ModBus data communications protocol, etc. In turn, the VFD 432 enables speed control of a three-phase AC motor 436 (broadly, a motor) that drives (e.g., mechanically spins, etc.) a second pump 440. The VFD 432 is operable for manipulating the frequency of the output by rectifying an incoming AC current into DC, and then using voltage pulse-width modulation (PWM) to recreate an AC current and voltage output waveform.

A communication link (e.g., hard wired connection, wireless connection, etc.) is provided from the controller 404 to the VFD 432. For example, a single cable or other suitable communication link may be provided from the controller 404 to the VFD 432. The controller 404 is configured to be operable for monitoring the one or more sensors 416. In response to the sensor output (e.g., received via a hard wired connection, wireless connection, etc.), the controller 404 is configured to be operable for controlling the VFD 432, e.g., to start, vary the RPMs (revolutions per minute), and stop the motor 436 based on the configured behavior, etc.

The same single controller 404 is also configured for controlling operation of the diesel engine 408 (broadly, an engine) that drives (e.g., mechanically spins, etc.) a first pump 412. For example, the controller 404 may send commands to the diesel engine's electronic control unit (ECU) via a controller area network (CAN bus).

The controller 404 is configured to be operable for receiving engine torque load information and/or engine instantaneous fuel consumption from the engine's electronic control unit. The controller 404 is configured to be operable for monitoring either or both of the engine torque load information and/or engine instantaneous fuel consumption information, received from the engine's electronic control unit, for fluctuation (e.g., significant drop/downward fluctuation in average magnitude and/or erratic, noisy, fluctuating data as shown in FIGS. 1 and 10, etc.) indicative of cavitation of the first pump 412.

The controller 404 may be operable for determining whether fluctuation of the monitored engine torque load is outside of an acceptable range or error threshold (e.g., +/−6%, higher or lower than +/−6%, a user-selected or adjusted positive/negative (+/−) percentage error threshold, etc.). For example, the controller 404 may be configured to be operable for executing a machine learning process during which the controller 404 learns steady state fluctuation of engine torque load and from that learns or establishes a default setting (e.g., +/−6%, etc.) for the acceptable range or error threshold for the fluctuation of engine torque load. The controller 404 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored engine torque load is outside its acceptable range or error threshold, the controller 404 (e.g., via application programming or software, etc.) may then issue a warning (e.g., a warning alarm, a shutdown alarm, display or present an error message, an alert indicating that maintenance is needed, etc.) and/or the controller 404 may initiate a shutdown of the engine 408 driving the pump 412.

Additionally, or alternatively, the controller 404 may be operable for determining whether fluctuation of the monitored engine instantaneous fuel consumption is outside of an acceptable range or error threshold (e.g., +/−6%, higher or lower than +/−6%, a user-selected or adjusted positive/negative (+/−) percentage error threshold, etc.). For example, the controller 404 may be configured to be operable for executing a machine learning process during which the controller 104 learns steady state fluctuation of engine instantaneous fuel consumption and from that learns or establishes a default setting (e.g., +1-6%, etc.) for the acceptable range or error threshold for the fluctuation of engine instantaneous fuel consumption. The controller 404 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored engine instantaneous fuel consumption is outside its acceptable range or error threshold, the controller 404 may then issue a warning and/or initiate a shutdown of the engine 408 driving the pump 412.

Additionally, or alternatively, the controller 404 may be operable for determining whether there is a significant drop in the average magnitude of the monitored engine torque load that exceeds an acceptable range or threshold, e.g., 15% to 20%, higher than 20%, a user-selected percentage threshold, etc. For example, the controller 404 may be configured to be operable for executing a machine learning process (e.g., a learning algorithm, etc.) during which the controller 404 learns or establishes a default setting (e.g., 15% to 20%, etc.) for the acceptable range or threshold for the significant drop in the average magnitude of the monitored engine torque load. The controller 404 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine torque load that exceeds the acceptable range or threshold, the controller 404 may then issue a warning and/or initiate a shutdown of the engine 408 driving the pump 412.

The controller 404 may also or instead be operable for determining whether there is a significant drop in the average magnitude of the monitored engine instantaneous fuel consumption that exceeds an acceptable range or threshold, e.g., 15% to 20%, higher than 20%, a user-selected percentage threshold, etc. For example, the controller 404 may be configured to be operable for executing a machine learning process (e.g., a learning algorithm, etc.) during which the controller 404 learns or establishes a default setting (e.g., 15% to 20%, etc.) for the acceptable range or threshold for the significant drop in the average magnitude of the monitored engine instantaneous fuel consumption. The controller 404 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine instantaneous fuel consumption that exceeds the acceptable range or threshold, the controller 404 may then issue a warning and/or initiate a shutdown of the engine 408 driving the pump 412.

The controller 404 is configured to be operable for monitoring either or both of the torque load and/or electrical power consumption of the motor 436 for fluctuation (e.g., significant drop/downward fluctuation in average magnitude and/or erratic, noisy, fluctuating data as shown in FIGS. 1 and 10, etc.) indicative of cavitation of the pump 440.

The controller 404 may be operable for determining whether fluctuation of the monitored motor torque load is outside of an acceptable range or error threshold (e.g., +/−6%, higher or lower than +/−6%, a user-selected or adjusted positive/negative (+/−) percentage error threshold, etc.). For example, the controller 404 may be configured to be operable for executing a machine learning process during which the controller 404 learns steady state fluctuation of motor torque load and from that learns or establishes a default setting (e.g., +/−6%, etc.) for the acceptable range or error threshold for the fluctuation of motor torque load. The controller 404 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored motor torque load is outside its acceptable range or error threshold, the controller 404 (e.g., via application programming or software, etc.) may then issue a warning and/or initiate a shutdown of the motor 436 driving the pump 440.

Additionally, or alternatively, the controller 404 may be operable for determining whether fluctuation of the monitored motor power consumption is outside of an acceptable range or error threshold (e.g., +/−6%, higher or lower than +/−6%, a user-selected or adjusted positive/negative (+/−) percentage error threshold, etc.). For example, the controller 404 may be configured to be operable for executing a machine learning process during which the controller 404 learns steady state fluctuation of motor power consumption and from that learns or establishes a default setting (e.g., +/−6%, etc.) for the acceptable range or error threshold for the fluctuation of motor power consumption. The controller 404 may be further configured to allow a user to increase or decrease the machine learned default setting for the acceptable range or error threshold. As an example, a user may increase the machine learned default setting (e.g., to a value higher than +/−6%, etc.) to avoid false triggers or false positive indications of pump cavitation.

If it is determined that the fluctuation of the monitored motor power consumption is outside its acceptable range or error threshold, the controller 404 may then issue a warning and/or initiate a shutdown of the motor 436 driving the pump 440.

Additionally, or alternatively, the controller 404 may be operable for determining whether there is a significant drop in the average magnitude of the monitored engine torque load that exceeds an acceptable range or threshold, e.g., 15% to 20%, higher than 20%, a user-selected percentage threshold, etc. For example, the controller 404 may be configured to be operable for executing a machine learning process (e.g., a learning algorithm, etc.) during which the controller 404 learns or establishes a default setting (e.g., 15% to 20%, etc.) for the acceptable range or threshold for the significant drop in the average magnitude of the monitored engine torque load. The controller 404 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored engine torque load that exceeds the acceptable range or threshold, the controller 404 may then issue a warning and/or initiate a shutdown of the motor 436 driving the pump 440.

The controller 404 may also or instead be operable for determining whether there is a significant drop in the average magnitude of the monitored motor power consumption that exceeds an acceptable range or threshold, e.g., 15% to 20%, higher than 20%, a user-selected percentage threshold, etc. For example, the controller 404 may be configured to be operable for executing a machine learning process (e.g., a learning algorithm, etc.) during which the controller 404 learns or establishes a default setting (e.g., 15% to 20%, etc.) for the acceptable range or threshold for the significant drop in the average magnitude of the monitored motor power consumption. The controller 404 may be further configured to allow a user to increase or decrease the acceptable range or threshold. As an example, a user may increase the machine learned default setting (e.g., to a value higher than 20%, etc.) to avoid false triggers or false positive indications of pump cavitation.

If it is determined that there is a significant drop in the average magnitude of the monitored motor power consumption that exceeds the acceptable range or threshold, the controller 404 may then issue a warning and/or initiate a shutdown of the motor 436 driving the pump 440.

FIG. 5 shows the sensors 416 remotely spaced apart from the engine 408, motor 436, and first and second pumps 412 and 440. But the system 400 may also include one or more sensor(s) that are a part of, integrated with, or built into the engine 408, motor 436, first pump 412, and/or second pump 440, such as a built-in pressure sensor within the first pump 412 and/or second pump 440, etc.

In exemplary embodiments, the controller may be configured to generate:

- a first alert whenever fluctuation of the monitored torque load exceeds a first acceptable range or error threshold;
- a second alert whenever fluctuation of the monitored fuel/power consumption exceeds a second acceptable range or error threshold; and
- a third alert whenever fluctuation of the monitored torque load exceeds a third acceptable range or error threshold and fluctuation of the monitored fuel/power consumption exceeds a fourth acceptable range or error threshold.

In this example, the first, second, third and fourth acceptable ranges or error thresholds may be the same (e.g., +/−6%, higher or lower than +/−6%, a user-selected or adjusted positive/negative (+/−) percentage error threshold, etc.). Or one of or more first, second, third and fourth acceptable ranges or error thresholds may be different than one or more of the others. In this latter example, the third and fourth acceptable ranges or error thresholds may be less than the first and second acceptable ranges or error thresholds, respectively.

Figure 6:
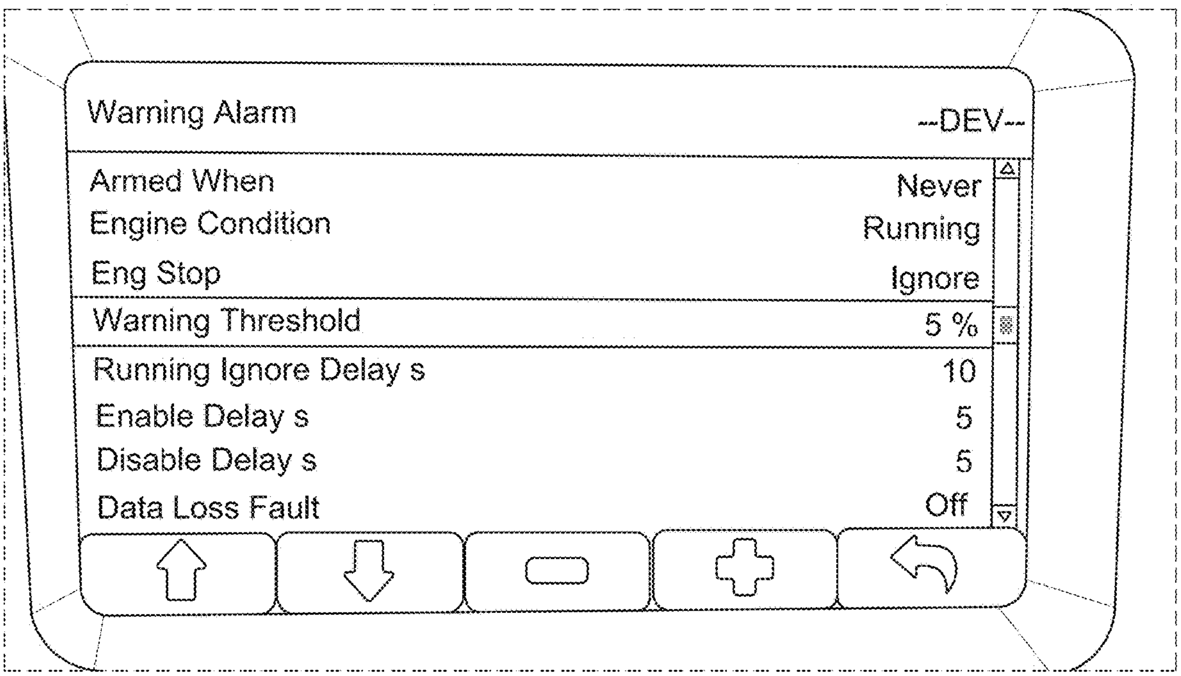
FIG. 6 shows an exemplary Warning Alarm menu on a display of a control panel according to an exemplary embodiment of the present disclosure.

FIG. 6 shows an exemplary Warning Alarm menu on a display of a control panel according to an exemplary embodiment of the present disclosure. As shown in FIG. 6, a 5% warning threshold has been selected for purposes of warning alarms. In this example, the control panel may thus be configured to issue a warning alarm when the controller determines that fluctuation of the monitored parameter (e.g., engine torque load, engine instantaneous fuel consumption, electric motor torque load, electric motor power consumption, combination thereof, etc.) as compared to steady-state/normal/acceptable fluctuation level(s) exceeds the 5% warning threshold selected by the user. Additionally, or alternatively, the control panel may be configured to issue a warning alarm when the controller determines that there is a significant drop in the average magnitude of the monitored parameter (e.g., engine torque load, engine instantaneous fuel consumption, electric motor torque load, electric motor power consumption, combination thereof, etc.) that exceeds the 5% warning threshold selected by the user. The 5% warning threshold may be increased or decreased by using touchscreen buttons along the bottom of the display. The touchscreen buttons may also be used for selecting and modifying other user selectable options shown in FIG. 6 including Armed When, Engine Condition, Engine Stop, Running Ignore Delay in seconds (s), Enable Delay (s), Disable Delay (s), and Data Loss Fault.

Figure 7:
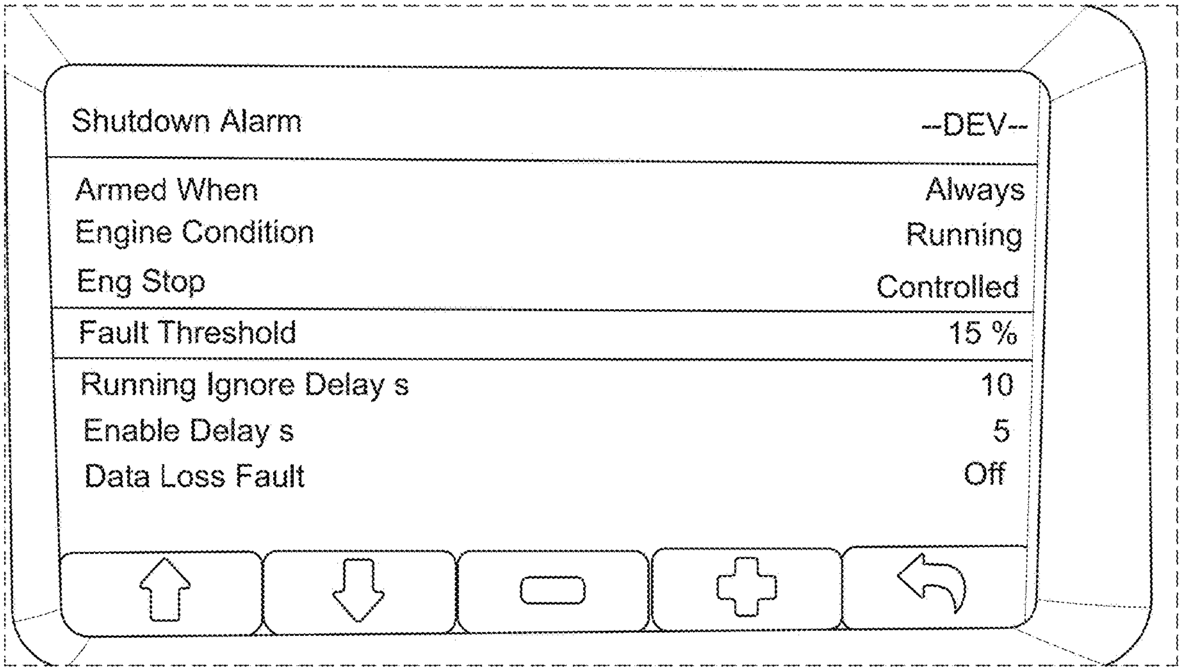
FIG. 7 shows an exemplary Shutdown Alarm menu on a display of a control panel according to an exemplary embodiment of the present disclosure.

FIG. 7 shows an exemplary Shutdown Alarm menu on a display of a control panel according to an exemplary embodiment of the present disclosure. As shown in FIG. 7, a 15% fault threshold has been selected for purposes of shutdown alarms. In this example, the control panel may thus be configured to issue a shutdown alarm when the controller determines that the fluctuation of the monitored parameter (e.g., engine torque load, engine instantaneous fuel consumption, electric motor torque load, electric motor power consumption, combination thereof, etc.) as compared to steady-state/normal/acceptable fluctuation level(s) exceeds the 15% fault threshold selected by the user. Additionally, or alternatively, the control panel may be configured to issue a shutdown alarm when the controller determines that there is a significant drop in the average magnitude of the monitored parameter (e.g., engine torque load, engine instantaneous fuel consumption, electric motor torque load, electric motor power consumption, combination thereof, etc.) that exceeds the 15% fault threshold selected by the user. The 15% fault threshold may be increased or decreased by using the touchscreen buttons along the bottom of the display. The touchscreen buttons may also be used for selecting and modifying other user selectable options shown in FIG. 7 including Armed When, Engine Condition, Engine Stop, Running Ignore Delay in seconds (s), Enable Delay (s), and Data Loss Fault.

Figure 8:
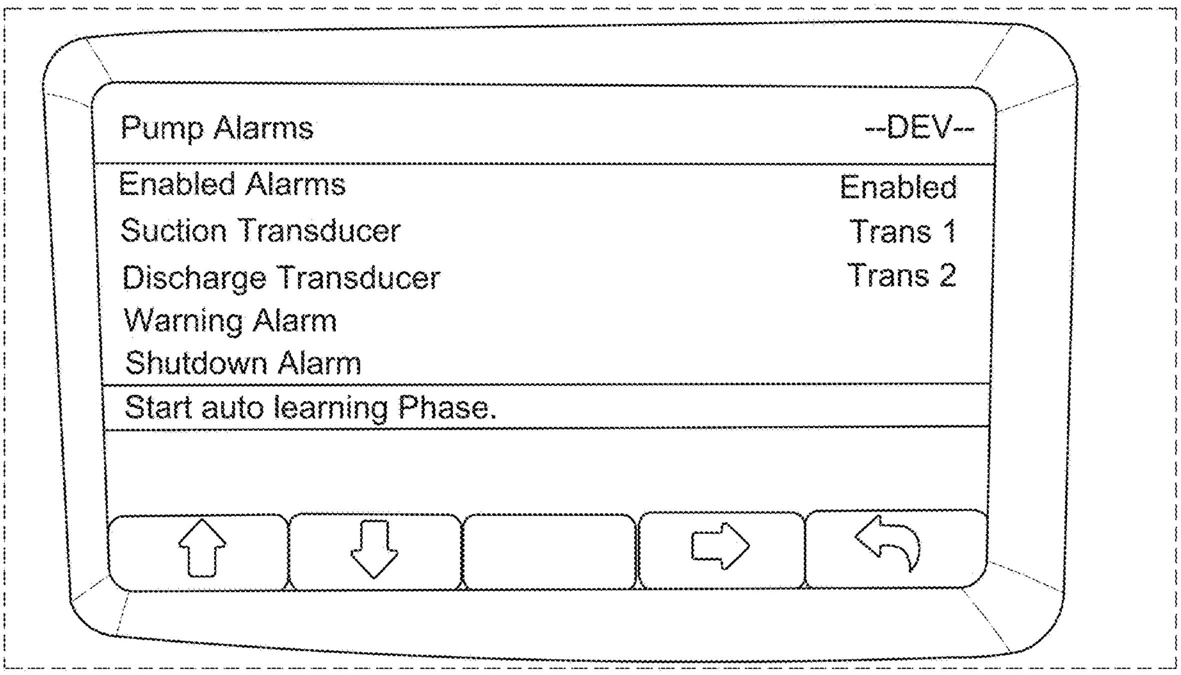
FIG. 8 shows an exemplary Pump Alarms menu on a display of a control panel according to an exemplary embodiment of the present disclosure.

FIG. 8 shows an exemplary Pump Alarms menu on a display of a control panel according to an exemplary embodiment of the present disclosure. As shown in FIG. 8, the start auto learning phase has been selected. Touchscreen buttons along the bottom of the display may also be used for selecting, modifying, and navigating to other user selectable options or menus shown in FIG. 8 including Enabled Alarms, Suction Transducer, Discharge Transducer, Warning Alarm (FIG. 6), and Shutdown Alarm (FIG. 7).

By way of example only, the control panel display shown in FIGS. 6, 7, and 8 may comprise a sunlight-viewable 4.3 inch diagonal WQVGA color display with five integrated backlit display buttons. Alternative embodiments may include or be used with control panels or devices having different displays and/or different user interfaces (e.g., push-button(s), joystick(s), touchscreen, etc.).

FIG. 10 is an exemplary line graph obtained or captured from a controller (e.g., a machine-learning control panel, etc.) while controlling a diesel-powered water pump according to an exemplary embodiment. As shown in FIG. 10, the line graph includes engine speed (RPM) along the left axis versus time offset (milliseconds) along the bottom axis. The right axis of the line graph includes cavitation status, instantaneous fuel consumption (in liters/hour), and engine torque load (as a percentage of maximum engine torque load) versus the time offset along the bottom axis. The cavitation status is a binary indicator, where 0 indicates that no cavitation was detected and 1 indicates that the controller detected cavitation using suction and discharge pressure sensors as well as a vibration sensor mounted to the pump. The diesel engine's instantaneous fuel consumption and torque load percentage are broadcasted by most electronically-controlled engines. Generally, the graph shows that when cavitation is detected by the controller (cavitation status line at a value of 1), the overall fuel consumption and torque both significantly drop in average magnitude and become very erratic (not smooth) as compared to times when cavitation is not occurring (cavitation status line at a value of 0). In exemplary embodiments, the controller may be configured to detect the significant drop/downward fluctuation in average magnitude (e.g., 15% to 20% change, etc.) of the diesel engine's instantaneous fuel consumption and/or to detect the significant drop/downward fluctuation in average magnitude (e.g., 15% to 20% change, etc.) of the engine torque load percentage. The detection of either or both significant drops in average magnitude of the diesel engine's instantaneous fuel consumption and engine torque load percentage are indicative of pump cavitation. In such exemplary embodiments, the controller may therebefore be able to detect pump cavitation after the machine/system has settled in at a particular RPM (e.g., about 1900 RPMs, etc.) by detecting either or both of a significant drop/downward fluctuation in average magnitude of the diesel engine's instantaneous fuel consumption and/or a significant drop/downward fluctuation in magnitude engine torque load percentage without having to also detect erratic behavior in the instantaneous fuel consumption and engine torque load percentage and without having to rely upon sensors (e.g., vibration sensor, etc.) to monitor the pump.

In exemplary embodiments, a controller is configured to be operable for detecting one or more or all of the following that may be used individually or in combination as an indicator of pump cavitation after the machine/system has settled in at a particular RPM:

(1) a significant drop/downward fluctuation in average magnitude of fuel/power consumption (e.g., engine instantaneous fuel consumption, motor power consumption); and/or (2) a significant drop/downward fluctuation in average magnitude of torque load percentage (e.g., engine torque load percentage, motor torque load percentage); and/or (3) erratic, noisy, fluctuating data (e.g., data that is changing over a short period of time) in the fuel/power consumption; and/or (4) erratic, noisy, fluctuating data in the torque load percentage.

By way of example, a controller disclosed herein (e.g., controller 104 (FIG. 2), controller 204 (FIG. 3), controllers 304A and 304B (FIG. 4), controller 404 (FIG. 5), etc.) may comprise a CANplus™ CP1000 control panel 904 (FIG. 9) that is configured to be operable for monitoring torque load and/or fuel/power consumption for fluctuation indicative of pump cavitation as disclosed herein. Exemplary embodiments may include a control panel having one or more features identical to or similar to a CANplus™ CP1000 control panel. For example, an exemplary embodiment may include a control panel that is a manual and autostart platform for electronically governed diesel or natural gas engines. The control panel may also or instead be configured to control mechanically governed diesel engines. The control panel may be configured to display graphical quad-gauge pages on a 4.3" diagonal WQVGA (480×272 pixels) liquid crystal display (LCD). The control panel may be configured to display SAE J1939 parameters reported by an ECU (Engine Control Unit), including, but not limited to the following: RPM, coolant temperature, oil pressure, engine hours, voltage, exhaust emissions system state and diagnostic codes. The backlit display of the control panel may be clearly readable in bright sunlight and total darkness and may be housed in a rugged IP66 rated housing. The control panel may include LEDs (e.g., three LEDs, etc.) to indicate Faults and Warnings, Emission-Related Alerts and Autostart active. The control panel may include display keys (e.g., five display keys, etc.) that are associated with a dynamic Display Key bar as well as control buttons (e.g., eight control buttons, etc.). The control panel may feature automatic start/stop control and start/stop modes using an Event Manager, which can start or stop based on any of the digital inputs, analog transducer inputs (e.g., six 4-20 mA analog transducer inputs, etc.), a real time clock, or combinations of date/time and analog or digital inputs. With the use of a transducer, the control panel may have a "cruise control" feature that automatically throttles the engine to maintain a configurable level. The control panel may be configured to use any one of the transducer inputs for the maintain/cruise control feature, regardless of whether that input is also being used as a start or stop event. The description in this paragraph of possible features that may be included with a control panel is provided for purpose of illustration and example only. In alternative exemplary embodiments, the control panel is configured differently, e.g., without one or more the feature(s) described in this paragraph, with different features and/or additional features than the features described in this paragraph, etc.

In exemplary embodiments, a controller disclosed herein (e.g., controller 104 (FIG. 2), controller 204 (FIG. 3), controllers 304A and 304B (FIG. 4), controller 404 (FIG. 5), a CANplus™ CP1000 control panel 904 (FIG. 9), other control panel, etc.) may be configured to include or be operable for executing a machine learning process (e.g., a learning algorithm, etc.) and a fluctuation detection process (e.g., a fluctuation detection algorithm, an adaptive detection method, etc.). In such embodiments, the controller may be configured to be operable for learning, via machine learning, steady-state fluctuation level(s) for torque load and/or fuel/power consumption, thereby enabling the controller to be operable for comparing fluctuation, if any, of the monitored torque load and/or fuel/power consumption to the learned steady-state fluctuation level(s) for detecting pump cavitation. The controller may be configured to algorithmically learn, via an artificial intelligence (AI) machine learning algorithm, the steady-state fluctuation level(s) for torque load and/or fuel/power consumption. The controller may be configured to be operable for executing a fluctuation detection algorithm (e.g., using standard deviations, an adaptive detection method, etc.) to detect fluctuation outliers over a period of time that are indicative of pump cavitation. For example, the controller may calculate and analyze standard deviation(s) of the steady-state fluctuation of the torque load and/or fuel/power consumption to detect fluctuation outliers over a period of time that are indicative of pump cavitation.

Also, the controller may be configured to include or be operable for executing a machine learning process as disclosed in U.S. patent application Ser. No. 18/220,686, which is incorporated herein by reference in its entirety.

The exemplary embodiments of the controllers disclosed herein (e.g., controller 104 (FIG. 2), controller 204 (FIG. 3), controllers 304A and 304B (FIG. 4), controller 404 (FIG. 5), a CANplus™ CP1000 control panel 904 (FIG. 9), other control panel, etc.) may be used in various types of systems, including water supply systems, wastewater systems (e.g., a sewer system bypass, sewer lift station, etc.), flood water management systems, industrial pumps, etc. But the exemplary controllers disclosed herein may also be used in other systems for detecting cavitation pumps and/or other system components and are not limited to use in any one particular type of system, motor, engine, machine, or pump.

In exemplary embodiments, a controller is configured to be operable for monitoring at least one of torque load and/or fuel/power consumption of an engine or electric motor for fluctuation indicative of pump cavitation, thereby enabling the controller to be operable for alerting to indications of pump cavitation when fluctuation of the monitored torque load and/or fuel/power consumption indicate pump cavitation.

In exemplary embodiments, the controller is configured to be operable for detecting a significant drop in average magnitude of the monitored fuel/power consumption that is indicative of pump cavitation; and/or detecting a significant drop in average magnitude of the monitored torque load that is indicative of pump cavitation.

In exemplary embodiments, the controller is configured to be operable for detecting one or more or all of the following, which are usable individually or in combination as an indicator of pump cavitation: a significant drop in average magnitude of the monitored fuel/power consumption; and/or a significant drop in average magnitude of monitored torque load; and/or erratic, noisy, fluctuating data in the monitored fuel/power consumption; and/or erratic, noisy, fluctuating data in the monitored torque load.

In exemplary embodiments, the controller is configured to be operable for monitoring torque load for a drop in average magnitude; determining whether the drop, if any, in the average magnitude of the monitored torque load is outside of an acceptable range or error threshold for the torque load; and generating an alert if any said drop in the average magnitude of the monitored torque load is outside of the acceptable range or error threshold for the torque load.

In exemplary embodiments, the controller is configured to be operable for monitoring fuel/power consumption for a drop in average magnitude; determining whether the drop, if any, in the average magnitude of the monitored fuel/power consumption is outside of an acceptable range or error threshold for the fuel/power consumption; and generating an alert if any said drop in the average magnitude of the monitored fuel/power consumption is outside of the acceptable range or error threshold for the fuel/power consumption.

In exemplary embodiments, the controller is configured to be operable for monitoring torque load and instantaneous fuel consumption of an engine for significant drops in average magnitude indicative of pump cavitation. Or he controller is configured to be operable for monitoring torque load and power consumption of an electric motor for significant drops in average magnitude indicative of pump cavitation.

In exemplary embodiments, the fluctuation indicative of cavitation of the pump includes a significant drop in average magnitude of torque load and/or instantaneous fuel consumption of an engine; or a significant drop in average magnitude of torque load and/or power consumption of an electric motor.

In exemplary embodiments, the controller is configured to be operable for monitoring torque load for fluctuation indicative of pump cavitation; determining whether fluctuation, if any, of the monitored torque load is outside of an acceptable range or error threshold of fluctuation for the torque load; and generating an alert if any said fluctuation of the monitored torque load is outside of the acceptable range or error threshold of fluctuation for the torque load. Additionally, or alternatively, the controller is configured to be operable for monitoring fuel/power consumption for fluctuation indicative of pump cavitation; determining whether fluctuation, if any, of the monitored fuel/power consumption is outside of an acceptable range or error threshold of fluctuation for the fuel/power consumption; and generating an alert if any said fluctuation of the monitored fuel/power consumption is outside of the acceptable range or error threshold of fluctuation for the fuel/power consumption. The controller may be configured to be operable for establishing, via machine learning, a setting or default for the acceptable range or error threshold for fluctuation of torque load; and/or establishing, via machine learning, a setting or default for the acceptable range or error threshold for fluctuation of fuel/power consumption.

In exemplary embodiments, the controller is configured to be operable for monitoring both torque load and fuel/power consumption of the engine or electric motor for fluctuation indicative of pump cavitation. And the controller is configured to be operable for detecting pump cavitation by using only the monitored torque load and the monitored fuel/power consumption without requiring reliance upon any existing or additional vibration sensors for detecting pump cavitation.

In exemplary embodiments, the controller is configured to be operable for monitoring either torque load or fuel/power consumption, but not both, for fluctuation indicative of pump cavitation. And the controller is configured to be operable for detecting pump cavitation by using only the monitored torque load or the monitored fuel/power consumption without requiring reliance upon any existing or additional vibration sensors for detecting pump cavitation.

In exemplary embodiments, the controller includes a user interface configured to allow one or more user inputs including selection of either or both of the torque load and/or fuel/power consumption to be monitored for fluctuation indicative of pump cavitation; and/or an acceptable range or error threshold for fluctuation of torque load, which may be an adjustment to a default setting established or machine learned by the controller for the acceptable range or error threshold for fluctuation of torque load; and/or an acceptable range or error threshold for fluctuation of fuel/power consumption, which may be an adjustment to a default setting established or machine learned by the controller for the acceptable range or error threshold for fluctuation of fuel/power consumption. The user interface may be configured to allow one or more user inputs including a positive/negative (+/−) percentage acceptable range or error threshold for fluctuation of torque load; and/or a positive/negative (+/−) percentage acceptable range or error threshold for fluctuation of fuel/power consumption.

In exemplary embodiments, the controller is configured to compare fluctuation, if any, of the monitored torque load and/or fuel/power consumption to steady-state fluctuation level(s) to determine whether any said fluctuation of the monitored torque load and/or fuel/power consumption deviated more than a positive/negative (+/−) percentage acceptable range or error threshold from the steady-state fluctuation level(s). And the controller is configured to be operable for generating an alert if any said fluctuation of the monitored torque load and/or fuel/power consumption deviates more than the positive/negative (+/−) percentage acceptable range or error threshold from the steady-state fluctuation level(s).

In exemplary embodiments, the controller is configured to be operable for learning, via machine learning, steady-state fluctuation level(s) for torque load and/or fuel/power consumption, thereby enabling the controller to be operable for comparing fluctuation, if any, of the monitored torque load and/or fuel/power consumption to the learned steady-state fluctuation level(s) for detecting pump cavitation. The controller may be configured to algorithmically learn, via an artificial intelligence (AI) machine learning algorithm, the steady-state fluctuation level(s) for torque load and/or fuel/power consumption.

In exemplary embodiments, the controller is configured to be operable for executing a fluctuation detection algorithm to detect fluctuation outliers of the torque load and/or fuel/power consumption over a period of time that are indicative of pump cavitation. Additionally, or alternatively, the controller is configured to be operable for calculating and analyzing standard deviation(s) of steady-state fluctuation of the torque load and/or fuel/power consumption to detect fluctuation outliers over a period of time that are indicative of pump cavitation.

In exemplary embodiments, a system comprises a controller as disclosed herein. The system further comprises a pump, an electric motor configured to be operable for driving the pump, and a variable frequency drive (VFD) configured to be operable for controlling a speed of the electric motor. The controller is configured to be operable for controlling the variable frequency drive; receiving electric motor torque load information and/or electric motor power consumption information; and monitoring the electric motor torque load information and/or electric motor power consumption information for fluctuation indicative of cavitation of the pump. The controller is further configured to be operable for generating an alert if any fluctuation of the monitored electric motor torque load information is outside of an acceptable range or error threshold of fluctuation for the electric motor torque load, and/or generating an alert if any fluctuation of the monitored electric motor power consumption information is outside of an acceptable range or error threshold of fluctuation for the electric motor power consumption.

In exemplary embodiments, a system comprises a controller as disclosed herein. The system further comprises a pump and an engine including an electronic control unit. The engine is configured to be operable for driving the pump.

The controller is configured to be operable for receiving engine torque load information and/or engine instantaneous fuel consumption from the electronic control unit of the engine; and monitoring at least one of the engine torque load information and/or engine instantaneous fuel consumption information, received from the engine's electronic control unit, for fluctuation indicative of cavitation of the pump. And the controller is further configured to be operable for; and generating an alert if any fluctuation of the monitored engine torque load information is outside of an acceptable range or error threshold of fluctuation for the engine torque load, and/or generating an alert if any fluctuation of the monitored engine instantaneous fuel consumption is outside of an acceptable range or error threshold of fluctuation for the engine instantaneous fuel consumption.

Also disclosed are exemplary methods that comprise monitoring at least one of torque load and/or fuel/power consumption of an engine or electric motor for fluctuation indicative of pump cavitation. In exemplary embodiments, the method comprises determining whether fluctuation, if any, of the monitored torque load is outside of an acceptable range or error threshold of fluctuation for the torque load; and generating an alert if any said fluctuation of the monitored torque load is outside of the acceptable range or error threshold of fluctuation for the torque load. Additionally, or alternatively, the method comprises determining whether fluctuation, if any, of the monitored fuel/power consumption is outside of an acceptable range or error threshold of fluctuation for the engine fuel/power consumption; and generating an alert if any said fluctuation of the monitored fuel/power consumption is outside of the acceptable range or error threshold of fluctuation for the fuel/power consumption.

In exemplary embodiments, the method includes monitoring engine torque load for a drop in average magnitude; determining whether the drop, if any, in the average magnitude of the monitored engine torque load is outside of an acceptable range or error threshold for the engine torque load; and generating an alert if any said drop in the average magnitude of the monitored engine torque load is outside of the acceptable range or error threshold for the engine torque load. Additionally, or alternatively, the method includes monitoring engine instantaneous fuel consumption for a drop in average magnitude; determining whether the drop, if any, in the average magnitude of the monitored engine instantaneous fuel consumption is outside of an acceptable range or error threshold for the engine instantaneous fuel consumption; and generating an alert if any said drop in the average magnitude of the monitored engine instantaneous fuel consumption is outside of the acceptable range or error threshold for the engine instantaneous fuel consumption.

In exemplary embodiments, the method includes monitoring electric motor torque load for a drop in average magnitude; determining whether the drop, if any, in the average magnitude of the monitored electric motor torque load is outside of an acceptable range or error threshold for the electric motor torque load; and generating an alert if any said drop in the average magnitude of the monitored electric motor torque load is outside of the acceptable range or error threshold for the electric motor torque load. Additionally, or alternatively, the method includes monitoring electric motor power consumption for a drop in average magnitude; determining whether the drop, if any, in the average magnitude of the monitored electric motor power consumption is outside of an acceptable range or error threshold for the electric motor power consumption; and generating an alert if any said drop in the average magnitude of the monitored electric motor power consumption is outside of the acceptable range or error threshold for the electric motor power consumption.

In exemplary embodiments, a non-transitory computer-readable storage media including executable instructions, that when executed by at least one processor, cause a controller to monitor at least one of torque load and/or fuel/power consumption of an engine or electric motor for fluctuation indicative of pump cavitation, thereby enabling the controller to be operable for alerting to indications of pump cavitation when fluctuation of the monitored torque load and/or fuel/power consumption indicate pump cavitation.

In exemplary embodiments of the non-transitory computer-readable storage media, the executable instructions include executable instructions, that when executed by the at least one processor, cause the controller to be operable for:

monitoring engine torque load for a drop in average magnitude; determining whether the drop, if any, in the average magnitude of the monitored engine torque load is outside of an acceptable range or error threshold for the engine torque load; and generating an alert if any said drop in the average magnitude of the monitored engine torque load is outside of the acceptable range or error threshold for the engine torque load; and/or monitoring engine instantaneous fuel consumption for a drop in average magnitude; determining whether the drop, if any, in the average magnitude of the monitored engine instantaneous fuel consumption is outside of an acceptable range or error threshold for the engine instantaneous fuel consumption; and generating an alert if any said drop in the average magnitude of the monitored engine instantaneous fuel consumption is outside of the acceptable range or error threshold for the engine instantaneous fuel consumption.

In exemplary embodiments of the non-transitory computer-readable storage media, the executable instructions include executable instructions, that when executed by the at least one processor, cause the controller to be operable for:

monitoring electric motor torque load for a drop in average magnitude; determining whether the drop, if any, in the average magnitude of the monitored electric motor torque load is outside of an acceptable range or error threshold for the electric motor torque load; and generating an alert if any said drop in the average magnitude of the monitored electric motor torque load is outside of the acceptable range or error threshold for the electric motor torque load; and/or monitoring electric motor power consumption for a drop in average magnitude; determining whether the drop, if any, in the average magnitude of the monitored electric motor power consumption is outside of an acceptable range or error threshold for the electric motor power consumption; and generating an alert if any said drop in the average magnitude of the monitored electric motor power consumption is outside of the acceptable range or error threshold for the electric motor power consumption.

As will be appreciated based on the foregoing specification, the above-described embodiments of the disclosure may be implemented using computer programming or engineering techniques including computer software, firmware, hardware, or any combination or subset thereof, wherein the technical effect may be achieved by performing the following operations: a controller monitoring at least one of torque load and/or fuel/power consumption of an engine or motor for fluctuation (e.g., significant drop/downward fluctuation in average magnitude and/or erratic, noisy, fluctuating data, etc.) indicative of pump cavitation, thereby enabling the controller to be operable for alerting to indications of pump cavitation when fluctuation of the monitored torque load and/or fuel/power consumption indicate pump cavitation.

Exemplary embodiments may include one or more processors and memory coupled to (and in communication with) the one or more processors. A processor may include one or more processing units (e.g., in a multi-core configuration, etc.) such as, and without limitation, a central processing unit (CPU), a microcontroller, a reduced instruction set computer (RISC) processor, an application specific integrated circuit (ASIC), a programmable logic device (PLD), a gate array, and/or any other circuit or processor capable of the functions described herein.

It should be appreciated that the functions described herein, in some embodiments, may be described in computer executable instructions stored on a computer readable media, and executable by at least one processor. The computer readable media is a non-transitory computer readable storage medium. By way of example, and not limitation, such computer-readable media can include dynamic random access memory (DRAM), static random access memory (SRAM), read only memory (ROM), erasable programmable read only memory (EPROM), solid state devices, flash drives, CD-ROMs, thumb drives, floppy disks, tapes, hard disks, other optical disk storage, magnetic disk storage or other magnetic storage devices, any other type of volatile or nonvolatile physical or tangible computer-readable media, or other medium that can be used to carry or store desired program code in the form of instructions or data structures and that can be accessed by a computer. Combinations of the above should also be included within the scope of computer-readable media.

Computer-executable instructions may be stored in the memory for execution by a processor to particularly cause the processor to perform one or more of the functions described herein, such that the memory is a physical, tangible, and non-transitory computer readable storage media. Such instructions often improve the efficiencies and/or performance of the processor that is performing one or more of the various operations herein. It should be appreciated that the memory may include a variety of different memories, each implemented in one or more of the functions or processes described herein.

It should also be appreciated that one or more aspects of the present disclosure transform a general-purpose computing device into a special-purpose computing device when configured to perform the functions, methods, and/or processes described herein.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purposes of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

The terminology used herein is for the purpose of describing particular example embodiments only and is not intended to be limiting. For example, when permissive phrases, such as "may comprise", "may include", and the like, are used herein, at least one embodiment comprises or includes the feature(s). As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A controller configured to be operable for:

monitoring at least one of torque load and/or fuel/power consumption of an engine or electric motor for fluctuation indicative of pump cavitation;

determining that the monitored at least one of torque load and/or fuel/power consumption has reached a steady-state operating condition;

monitoring, after the steady-state operating condition is reached, fluctuation of the monitored at least one of torque load and/or fuel/power consumption;

detecting, based on the fluctuation, one or more cavitation-indicative signal characteristics including (i) a significant drop in average magnitude and/or (ii) erratic, noisy, or non-periodic fluctuation behavior over time;

comparing the detected fluctuation to a steady-state fluctuation baseline level;

determining that pump cavitation is present when the fluctuation exhibits at least one of said cavitation-indicative signal characteristics relative to the steady-state fluctuation baseline level; and generating an alert indicative of pump cavitation;

wherein the controller is operable for detecting the pump cavitation without requiring vibration sensor input.

2. The controller of claim 1, wherein in the controller is configured to be operable for:

detecting a significant drop in average magnitude of the monitored fuel/power consumption and evaluating temporal variability indicative of erratic fluctuation behavior that is indicative of pump cavitation; and/or detecting a significant drop in average magnitude of the monitored torque load and evaluating temporal variability indicative of erratic fluctuation behavior that is indicative of pump cavitation.

3. The controller of claim 1, wherein the controller is configured to be operable for detecting two or more or all of the following in combination as an indicator of pump cavitation:

a significant drop in average magnitude of the monitored fuel/power consumption;

a significant drop in average magnitude of monitored torque load;

erratic, noisy, fluctuating data in the monitored fuel/power consumption; and erratic, noisy, fluctuating data in the monitored torque load.

4. The controller of claim 1, wherein the controller is configured to be operable for:

monitoring torque load for a drop in average magnitude;

determining whether the drop, if any, in the average magnitude of the monitored torque load is outside of an acceptable range or error threshold for the torque load that is defined relative to a learned steady-state fluctuation profile; and generating an alert if any said drop in the average magnitude of the monitored torque load is outside of the acceptable range or error threshold for the torque load.

5. The controller of claim 1, wherein the controller is configured to be operable for:

monitoring fuel/power consumption for a drop in average magnitude;

determining whether the drop, if any, in the average magnitude of the monitored fuel/power consumption is outside of an acceptable range or error threshold for the fuel/power consumption that is defined relative to a learned steady-state fluctuation profile; and generating an alert if any said drop in the average magnitude of the monitored fuel/power consumption is outside of the acceptable range or error threshold for the fuel/power consumption.

6. The controller of claim 1, wherein:

the controller is configured to be operable for monitoring torque load and instantaneous fuel consumption of an engine for significant drops exceeding 15% in average magnitude indicative of pump cavitation; or the controller is configured to be operable for monitoring torque load and power consumption of an electric motor for significant drops exceeding 15% in average magnitude indicative of pump cavitation.

7. The controller of claim 1, wherein the steady-state operating condition comprises operation at a substantially constant speed for a predetermined duration.

8. The controller of claim 1 wherein:

the controller is configured to be operable for monitoring torque load for fluctuation indicative of pump cavitation; determining whether fluctuation, if any, of the monitored torque load is outside of an acceptable range or error threshold of fluctuation for the torque load that is defined relative to a learned steady-state fluctuation profile for the torque load; and generating an alert if any said fluctuation of the monitored torque load is outside of the acceptable range or error threshold of fluctuation for the torque load; and/or the controller is configured to be operable for monitoring fuel/power consumption for fluctuation indicative of pump cavitation; determining whether fluctuation, if any, of the monitored fuel/power consumption is outside of an acceptable range or error threshold of fluctuation for the fuel/power consumption that is defined relative to a learned steady-state fluctuation profile for the fuel/power consumption; and generating an alert if any said fluctuation of the monitored fuel/power consumption is outside of the acceptable range or error threshold of fluctuation for the fuel/power consumption.

9. The controller of claim 8, wherein the controller is configured to be operable for:

establishing, via machine learning, a setting or default for the acceptable range or error threshold for fluctuation of torque load, the learned steady-state fluctuation profile for the torque load as a function of temporal variability and magnitude characteristics of the monitored signal, and normal fluctuation behavior for the torque load after system stabilization; and/or establishing, via machine learning, a setting or default for the acceptable range or error threshold for fluctuation of fuel/power consumption, the learned steady-state fluctuation profile for the fuel/power consumption as a function of temporal variability and magnitude characteristics of the monitored signal, and normal fluctuation behavior for the fuel/power consumption after system stabilization.

10. The controller of claim 1, wherein:

the controller is configured to be operable for monitoring both torque load and fuel/power consumption of the engine or electric motor for fluctuation indicative of pump cavitation; and the controller is configured to be operable for detecting pump cavitation by using only the monitored torque load and the monitored fuel/power consumption without requiring reliance upon any existing or additional vibration sensors for detecting pump cavitation.

11. The controller of claim 1, wherein:

the controller is configured to be operable for monitoring either torque load or fuel/power consumption, but not both, for fluctuation indicative of pump cavitation; and the controller is configured to be operable for detecting pump cavitation by using only the monitored torque load or the monitored fuel/power consumption without requiring reliance upon any existing or additional vibration sensors for detecting pump cavitation.

12. The controller of claim 1, wherein the controller includes a user interface configured to allow one or more user inputs including:

selection of either or both of the torque load and/or fuel/power consumption to be monitored for fluctuation indicative of pump cavitation; and/or an acceptable range or error threshold for fluctuation of torque load, which may be an adjustment to a default setting established or machine learned by the controller for the acceptable range or error threshold for fluctuation of torque load; and/or an acceptable range or error threshold for fluctuation of fuel/power consumption, which may be an adjustment to a default setting established or machine learned by the controller for the acceptable range or error threshold for fluctuation of fuel/power consumption.

13. The controller of claim 1, wherein the controller includes a user interface configured to allow user input selection of which fluctuation characteristics (magnitude drop, variability, or both) are used for cavitation detection and/or adjustment of thresholds relative to a learned steady-state fluctuation profile.

14. The controller of claim 1, wherein:

the controller is configured to compare fluctuation, if any, of the monitored torque load and/or fuel/power consumption to steady-state fluctuation level(s) to determine whether any said fluctuation of the monitored torque load and/or fuel/power consumption deviated more than a positive/negative (+/−) percentage acceptable range or error threshold from the steady-state fluctuation level(s); and the controller is configured to be operable for generating an alert if any said fluctuation of the monitored torque load and/or fuel/power consumption deviates more than the positive/negative (+/−) percentage acceptable range or error threshold from the steady-state fluctuation level(s).

15. The controller of claim 1, wherein the controller is configured to be operable for learning, via machine learning, steady-state fluctuation level(s) for torque load and/or fuel/power consumption, thereby enabling the controller to be operable for comparing fluctuation, if any, of the monitored torque load and/or fuel/power consumption to the learned steady-state fluctuation level(s) for detecting pump cavitation, wherein the controller is for a wastewater or flood water management system including a diesel engine for driving an industrial water pump, which is operable for transferring water from a water source, a lake, a pond, or a river to a second location, and wherein the controller is configured to:

monitor either or both of torque load and fuel consumption of the engine for fluctuation indicative of pump cavitation;

after the system has settled in at a particular RPM detect either or both of:

a significant downward fluctuation exceeding 15% in the average magnitude of the monitored fuel consumption that is indicative of pump cavitation; and a significant downward fluctuation exceeding 15% in the average magnitude of the monitored torque load that is indicative of pump cavitation;

alert to indications of pump cavitation when the controller detects either or both of the significant downward fluctuation in the monitored fuel consumption that is indicative of pump cavitation and the significant downward fluctuation in the monitored torque load that is indicative of pump cavitation;

determine whether fluctuation, if any, of the monitored torque load is outside of an acceptable range or error threshold of fluctuation for the torque load;

generate an alert if any said fluctuation of the monitored torque load is outside of the acceptable range or error threshold of fluctuation for the torque load;

determine whether fluctuation, if any, of the monitored fuel consumption is outside of an acceptable range or error threshold of fluctuation for the fuel consumption;

generate an alert if any said fluctuation of the monitored fuel consumption is outside of the acceptable range or error threshold of fluctuation for the fuel consumption;

establish, via machine learning, a setting or default for the acceptable range or error threshold for fluctuation of torque load; and establish, via the machine learning, a setting or default for the acceptable range or error threshold for fluctuation of fuel/power consumption.

16. The controller of claim 1, wherein cavitation is detected only when both: (i) a drop in average magnitude, and (ii) increased short-term variability occur concurrently.

17. The controller of claim 1, wherein:
the controller is configured to be operable for executing a fluctuation detection algorithm to detect fluctuation outliers of the torque load and/or fuel/power consumption over a period of time that are indicative of pump cavitation; and/or
the controller is configured to be operable for calculating and analyzing standard deviation(s) of steady-state fluctuation of the torque load and/or fuel/power consumption to detect fluctuation outliers over a period of time that are indicative of pump cavitation.

18. A system comprising:
the controller according to claim 1;
a pump;
an electric motor configured to be operable for driving the pump; and
a variable frequency drive (VFD) configured to be operable for controlling a speed of the electric motor;
wherein the controller configured to be operable for:
controlling the variable frequency drive;
receiving electric motor torque load information and/or electric motor power consumption information;
monitoring the electric motor torque load information and/or electric motor power consumption information for fluctuation indicative of cavitation of the pump; and
generating an alert if any fluctuation of the monitored electric motor torque load information is outside of an acceptable range or error threshold of fluctuation for the electric motor torque load, and/or generating an alert if any fluctuation of the monitored electric motor power consumption information is outside of an acceptable range or error threshold of fluctuation for the electric motor power consumption.

19. A system comprising:
the controller according to claim 1;
a pump; and
an engine including an electronic control unit, the engine configured to be operable for driving the pump;
wherein the controller is configured to be operable for:
receiving engine torque load information and/or engine instantaneous fuel consumption from the electronic control unit of the engine;
monitoring at least one of the engine torque load information and/or engine instantaneous fuel consumption information, received from the engine's electronic control unit, for fluctuation indicative of cavitation of the pump; and
generating an alert if any fluctuation of the monitored engine torque load information is outside of an acceptable range or error threshold of fluctuation for the engine torque load, and/or generating an alert if any fluctuation of the monitored engine instantaneous fuel consumption is outside of an acceptable range or error threshold of fluctuation for the engine instantaneous fuel consumption.

20. A method comprising monitoring at least one of torque load and/or fuel/power consumption of an engine or electric motor for fluctuation indicative of pump cavitation, wherein the method further comprises:
determining that the monitored at least one of torque load and/or fuel/power consumption has reached a steady-state operating condition;
monitoring, after the steady-state operating condition is reached, fluctuation of the monitored at least one of torque load and/or fuel/power consumption;
detecting, based on the fluctuation, one or more cavitation-indicative signal characteristics including (i) a significant drop in average magnitude and/or (ii) erratic, noisy, or non-periodic fluctuation behavior over time;
comparing the detected fluctuation to a steady-state fluctuation baseline level;
determining that pump cavitation is present when the fluctuation exhibits at least one of said cavitation-indicative signal characteristics relative to the steady-state fluctuation baseline level; and
generating an alert indicative of pump cavitation.

21. The method of claim 20, wherein:
the method includes monitoring engine torque load for a drop in average magnitude; determining whether the drop, if any, in the average magnitude of the monitored engine torque load is outside of an acceptable range or error threshold for the engine torque load that is defined relative to a learned steady-state fluctuation profile; and generating an alert if any said drop in the average magnitude of the monitored engine torque load is outside of the acceptable range or error threshold for the engine torque load; and/or
the method includes monitoring engine instantaneous fuel consumption for a drop in average magnitude; determining whether the drop, if any, in the average magnitude of the monitored engine instantaneous fuel consumption is outside of an acceptable range or error threshold for the engine instantaneous fuel consumption that is defined relative to a learned steady-state fluctuation profile; and generating an alert if any said drop in the average magnitude of the monitored engine instantaneous fuel consumption is outside of the acceptable range or error threshold for the engine instantaneous fuel consumption.

22. The method of claim 20, wherein:
the method includes monitoring electric motor torque load for a drop in average magnitude; determining whether the drop, if any, in the average magnitude of the monitored electric motor torque load is outside of an acceptable range or error threshold for the electric motor torque load that is defined relative to a learned steady-state fluctuation profile; and generating an alert if any said drop in the average magnitude of the monitored electric motor torque load is outside of the acceptable range or error threshold for the electric motor torque load; and/or
the method includes monitoring electric motor power consumption for a drop in average magnitude; determining whether the drop, if any, in the average magnitude of the monitored electric motor power consumption is outside of an acceptable range or error threshold for the electric motor power consumption that is defined relative to a learned steady-state fluctuation profile; and generating an alert if any said drop in the average magnitude of the monitored electric motor power consumption is outside of the acceptable range or error threshold for the electric motor power consumption.

23. A non-transitory computer-readable storage media including executable instructions, that when executed by at least one processor, cause a controller to perform the method of claim 20.

24. The non-transitory computer-readable storage media of claim 23, wherein the executable instructions include executable instructions, that when executed by the at least one processor, cause the controller to be operable for:

monitoring electric motor torque load for a drop in average magnitude; determining whether the drop, if any, in the average magnitude of the monitored electric motor torque load is outside of an acceptable range or error threshold for the electric motor torque load that is defined relative to a learned steady-state fluctuation profile; and generating an alert if any said drop in the average magnitude of the monitored electric motor torque load is outside of the acceptable range or error threshold for the electric motor torque load; and/or monitoring electric motor power consumption for a drop in average magnitude; determining whether the drop, if any, in the average magnitude of the monitored electric motor power consumption is outside of an acceptable range or error threshold for the electric motor power consumption that is defined relative to a learned steady-state fluctuation profile; and generating an alert if any said drop in the average magnitude of the monitored electric motor power consumption is outside of the acceptable range or error threshold for the electric motor power consumption.

25. A controller for a wastewater or flood water management system including a diesel engine for driving an industrial water pump, which is operable for transferring water from a water source, a lake, a pond, or a river to a second location, wherein the controller is configured to:

monitor either or both of torque load and fuel consumption of the engine for fluctuation indicative of pump cavitation;

after the system has settled in at a particular RPM detect either or both of:

a significant downward fluctuation exceeding 15% in the average magnitude of the monitored fuel consumption that is indicative of pump cavitation; and a significant downward fluctuation exceeding 15% in the average magnitude of the monitored torque load that is indicative of pump cavitation;

alert to indications of pump cavitation when the controller detects either or both of the significant downward fluctuation in the monitored fuel consumption that is indicative of pump cavitation and the significant downward fluctuation in the monitored torque load that is indicative of pump cavitation;

determine whether fluctuation, if any, of the monitored torque load is outside of an acceptable range or error threshold of fluctuation for the torque load;

generate an alert if any said fluctuation of the monitored torque load is outside of the acceptable range or error threshold of fluctuation for the torque load;

determine whether fluctuation, if any, of the monitored fuel consumption is outside of an acceptable range or error threshold of fluctuation for the fuel consumption;

generate an alert if any said fluctuation of the monitored fuel consumption is outside of the acceptable range or error threshold of fluctuation for the fuel consumption;

establish, via machine learning, a setting or default for the acceptable range or error threshold for fluctuation of torque load;

establish, via the machine learning, a setting or default for the acceptable range or error threshold for fluctuation of fuel/power consumption; and learn, via an artificial intelligence machine learning, steady-state fluctuation level(s) for torque load and fuel consumption, thereby enabling the controller to compare fluctuation, if any, of the monitored torque load and fuel consumption to the learned steady-state fluctuation level(s) for detecting pump cavitation.

* * * * *